(12) United States Patent
Gorbachov

(10) Patent No.: US 11,190,152 B2
(45) Date of Patent: Nov. 30, 2021

(54) CONTROL CIRCUIT FOR A RADIO FREQUENCY POWER AMPLIFIER

(71) Applicant: OctoTech, Inc., Irvine, CA (US)

(72) Inventor: Oleksandr Gorbachov, Irvine, CA (US)

(73) Assignee: BeRex, Inc., Santa Clara, CA (US)

( * ) Notice: Subject to any disclaimer, the term of this patent is extended or adjusted under 35 U.S.C. 154(b) by 158 days.

(21) Appl. No.: 16/685,655

(22) Filed: Nov. 15, 2019

(65) Prior Publication Data

US 2020/0162035 A1 May 21, 2020

Related U.S. Application Data

(60) Provisional application No. 62/767,940, filed on Nov. 15, 2018.

(51) Int. Cl.
*H03F 3/16* (2006.01)
*H03F 3/193* (2006.01)
(Continued)

(52) U.S. Cl.
CPC ........... *H03F 3/193* (2013.01); *H03F 1/0261* (2013.01); *H03F 1/301* (2013.01); *H03F 1/3205* (2013.01); *H03F 1/565* (2013.01); *H03F 3/45183* (2013.01); *H03H 11/32* (2013.01); *H03F 2200/18* (2013.01); *H03F 2200/451* (2013.01); *H03F 2200/69* (2013.01)

(58) Field of Classification Search
CPC ...... H03F 3/193; H03F 3/45183; H03F 1/301; H03F 1/3205; H03F 1/565; H03F 1/0261; H03F 2200/451; H03F 2200/69; H03F 2200/18; H03F 2200/447; H03F 3/195; H03F 3/1935; H03F 2200/372; H03H 11/32; H01L 2924/3011; H01L 23/66
USPC ................................................. 330/277, 307
See application file for complete search history.

(56) References Cited

U.S. PATENT DOCUMENTS 7,323,391 B2 * 1/2008 Arghavani .......... H01L 29/7848
438/285
9,806,679 B2 10/2017 Gorbachov
(Continued)

FOREIGN PATENT DOCUMENTS

WO WO2015196575 12/2015
WO WO2016169317 10/2016

*Primary Examiner* — Khanh V Nguyen
(74) *Attorney, Agent, or Firm* — Eric Karich; Karich & Associates

(57) ABSTRACT

A radio frequency (RF) power amplifier (PA) for amplifying an RF signal between a source node and an output node, the RF PA including a silicon substrate with a complementary metal oxide semiconductor (CMOS) N-type transistor with a source region and a drain region fabricated therein. The source region includes the source node of the RF PA and the drain region includes the output node of the RF PA. The RF PA includes a planar resistor fabricated on the surface of the silicon substrate proximal to the drain region of the N-type transistor, wherein the resistor provides a thermal source for heating the RF PA; and a control circuit providing thermal heating to the RF PA by providing power to the planar resistor during RF signal bursts wherein the added thermal heating compensates transient heating within the transistor and results in a linear power amplification operation.

20 Claims, 15 Drawing Sheets

(51) Int. Cl.
*H03F 3/45* (2006.01)
*H03F 1/30* (2006.01)
*H03F 1/32* (2006.01)
*H03F 1/56* (2006.01)
*H03H 11/32* (2006.01)
*H03F 1/02* (2006.01)

(56) References Cited

U.S. PATENT DOCUMENTS

| | | | |
|---|---|---|---|
| 10,001,936 B2* | 6/2018 | Matsumoto | G06F 3/0619 |
| 10,177,716 B2* | 1/2019 | McPartlin | H01L 23/5223 |
| 2018/0069079 A1* | 3/2018 | Fanelli | H01L 29/408 |

* cited by examiner

CONTROL CIRCUIT FOR A RADIO FREQUENCY POWER AMPLIFIER

CROSS-REFERENCE TO RELATED APPLICATIONS

This application for a utility patent claims the benefit of U.S. Provisional Application No. 62/767,940, filed Nov. 15, 2018.

BACKGROUND OF THE INVENTION

Field of the Invention

This invention relates generally to a control circuit for a radio frequency power amplifier, and more particularly to a control circuit for a radio frequency power amplifier with a temperature controller.

Description of Related Art

Wireless communications systems are utilized in a variety of contexts involving information transfer over long and short distances alike, and a wide range of modalities for addressing the particular needs of each being known in the art. As a general matter, wireless communications involve an RF carrier signal that is variously modulated to represent information/data, and the encoding, modulation, transmission, reception, de-modulation, and decoding of the signal conform to a set of standards for coordination of the same.

In the local area networking context, WLAN or Wireless LAN, also commonly referred to as WiFi as well as 802.11 (referring to the governing IEEE standard), is the most widely deployed. The later, more advanced WiFi standards such as 802.11 ac, and the previous 802.11 In and 802.11a standards on which it was based specify an orthogonal frequency division multiplexing system where equally spaced subcarriers at different frequencies are used to transmit data. Several computer systems or network nodes within a local area can connect to an access point, which in turn may provide a link to other networks and the greater global Internet network. Computing devices of all form factors, from mobile phones, tablets, and personal computers now have WiFi connectivity, and WiFi networks may be found everywhere.

As is fundamental to any wireless communications systems, a WiFi network interface device includes a transceiver, that is, a combined transmitter and receiver circuitry. The transceiver, with its digital baseband system, encodes the digital data to an analog baseband signal, and modulates the baseband signal with an RF carrier signal. Upon receipt, the transceiver down-converts the RF signal, demodulates the baseband signal, and decodes the digital data represented by the baseband signal. An antenna connected to the transceiver converts the electrical signal to electromagnetic waves, and vice versa. In most cases, the transceiver circuitry itself does not generate sufficient power or have sufficient sensitivity necessary for communications. Thus, additional circuits are referred to as a front end is utilized between the transceiver and the antenna. The front end includes a power amplifier for boosting transmission power, and/or a low noise amplifier to increase reception sensitivity.

RF power amplifiers utilized in WiFi systems ideally have linear performance, which is described in terms of the error vector magnitude (EVM) of the transmitted signal. Linear performance occurs when the output of the RF power amplifier is proportional to its input, but the output is able to deliver more power into a load without altering a content of its input. In order to conserve energy, the power amplifier is turned on and off in accordance with the transmit signal burst applied to its input. However, such switching generates transient current, voltage, power gain, phase, and so on. In particular, the edges of ramping signals results in a deterioration of EVM, also referred to as dynamic EVM, which is understood to differ from static EVM, where the control signal applied to the power amplifier is in a continuously on state.

In addition to the transient signals attributable to the dynamically switching currents and voltages, thermal properties of the transistors in the power amplifier circuitry also contribute to transient signals. In the publication "Static and Dynamic Error Vector Magnitude Behavior of 2.4-GHz Power Amplifier", Sang-Woong Yoon, IEEE Transactions on Microwave Theory and Techniques, Vol. 55, No. 4, April 2007, a thermal effects influence on dynamic EVM was presented, and compared to static EVM. The explanation was limited, however, to the output power level change during burst, which is understood to be equivalent to gain change. Conventional communications systems can readily demodulate signals with the small power level variations described. While the root cause of thermal heating affecting dynamic EVM was explored, only a partial explanation was proposed.

Subsequently, in the publication "Self-heating and Memory Effects in RF Power Amplifiers Explained Through Electro-Thermal Modeling", Wei Wei, et al., in NORCHIP 2013, November 2013, it was discovered that there are both amplitude-amplitude (AM-AM) and amplitude-phase (AM-PM) distortions that may be found in the modulated signal as a result of thermal effects. These distortions were found to influence the level and phase of the intermodulation products. According to the described simulation, even below a 50 kHz two-tone spacing, there was no difference in left- and right-side products of intermodulation distortion. In actual implementation, envelope variations may be at a rate of several megahertz or tens of megahertz. Such fast variation of frequency is not understood to cause a fast and large variation of power amplifier transistor temperatures within the semiconductor die. In WiFi systems utilizing conventional gallium arsenide (GaAs) or silicon technologies, the thermal time constant for power amplifier transistor stages can range from several microseconds to several tens of microseconds.

A technique for compensating for power amplifier transients at the beginning of the transmission burst is disclosed in U.S. Pat. No. 8,260,224 to Doherty et al. This technique is understood to require a pulsed "pre-heating" by a high current for over hundreds of microseconds before the RF signal burst with consecutive current shaping. Such "pre-heating" is understood to be impractical for WiFi signals, as incoming RF signal bursts are dependent on multiple factors according to the network protocol. Problematically, the delay of the RF transmit signal is understood to result in a substantial reduction in data throughput. Furthermore, an additional control input/timing is needed, and though this is typically lacking in existing WiFi platform solutions.

U.S. Pat. App. Pub. No. 2013/0307625 to Hershberger et al. disclosed a bias boost circuit that is applied to the base of the RF transistor in the WiFi power amplifier. A constant bias is applied during the RF signal burst, in addition to an exponentially decaying boost current that is applied at the beginning of the burst to compensate for RF transients. Although this technique may be suitable for power amplifiers implemented with bipolar transistors, in CMOS-based power amplifiers, a high level of transients may be generated, and degrade dynamic EVM further.

U.S. Pat. App. Pub. No. 2013/0127540 to Kim et al. disclosed a power amplifier with phase compensation circuitry. Specifically, phase compensation over the RF signal power level with a pre-distortion for linear power amplifiers is disclosed, but is not understood to be useful for minimizing dynamic EVM variations at signal burst edges.

A transient compensation circuit particular to WiFi power amplifiers is disclosed in U.S. Pat. No. 7,532,066 to Struble, et al. A current steering circuit is used to add current at the beginning of an RF signal burst along the same lines as Hershberger. However, dynamic degradation is not considered, and the solution appears limited to power level dependence.

In a publication entitled "Front-end Modules with Versatile Dynamic EVM Correction for 802.11 Applications in the 2 GHz Band", Samelis, et al., 2014 IEEE Topical Conference on Power Amplifiers for Wireless and Radio Applications (PAWR), January 2014, test results of a dynamic EVM compensation circuit implemented with silicon-germanium (SiGe) heterojunction bipolar transistor (HBT) power amplifiers for a WiFi front end circuit are disclosed. Thermal dependence was indicated as the root cause of dynamic EVM for different burst conditions, but only fairly short burst windows of approximately 176 microseconds were considered, which are typical for mobile applications. In the proposed circuit, digital settings would be needed during preliminary calibration at different power levels. Furthermore, the proposed circuit is understood to be unsuitable for increased bias voltages that are typical of more recent modulation schemes such as those specified in the 802.11ac standard.

Along these lines, recent WiFi systems implementing 802.11n and/or 802.11ac may employ a wider burst of up to several milliseconds to transmit a larger amount of data as would be typical in access point or router operation. The more substantial thermal issues along with higher transmit power levels complicate dynamic EVM compensation circuits. While suitable for such high power applications, GaAs semiconductor material has approximately three times the thermal resistance of silicon material, so circuits fabricated therewith are understood to be more prone to transients and dynamic EVM deterioration at different burst conditions.

A publication entitled "Evaluation of Envelope-Domain Dynamic X-Parameter Model Based on Variable-Carrier-Frequency Analysis", Zhang et al., 2015 5$^{th}$ Global Symposium on Millimeter Waves (GSMM 2012), proposes a theoretical behavioural model (referred to as "dynamic X-parameters") to take into account thermal transients for PA driven by the pulsed RF signal. Both amplitude and phase characteristics are considered, however, experiments are presented only for short thermal transient characteristics and no explanation of EVM change over different burst conditions is provided.

A publication entitled "Compensation of Transmission Non-Linearity Distortion with Memory Effect for a WLAn801.11a Transmitter", Sadeghpour et al., EIT Science, Measurement and Technology, revised Oct. 26, 2011, describes a complex digital pre-distortion scheme to compensate memory effects in high power WiFi PA. However, this publication does not address dynamic EVM behavior.

An in depth investigation of "dynamic X-parameters" is presented in a publication entitled "New Trends for the Nonlinear Measurement and Modeling of High-Power RF Transistors and Amplifiers with Memory Effects", Roblin et al., IEEE Transactions on Microwave Theory and Techniques, vol. 60, no. 6, June 2012, for WCDMA signals focusing on thermal dynamics influence on signal ACPR. The publication does not address EVM characteristics and turn-on and turn-off transients.

A publication entitled "A Simple Envelope Model for Nonlinear Power Amplifiers with Memory Effects Based on Volterra Expansion", Zhang et al., Proceedings of Asia-Pacific Microwave Conference 2010, details theoretical work based on Volterra series analysis. However, only two-tone excitation is considered and spectrum re-growth characteristics are elaborated. No thermal transients at the beginning and end of burst signal are presented.

Behavioral model in a publication entitled "Behavioral Modeling of Nonlinear RF Power Amplifiers Considering Memory Effects," Ku et al., IEEE Transactions on Microwave Theory and Techniques, vol. 51, no. 12, December 2003, also focuses on only two-tone and CDMA signal IMD distortions without considering EVM.

U.S. Pat. No. 9,806,679B2 to Gorbachov provides a solution for stabilizing dynamic EVM for WiFi amplifiers based on CMOS technology taking into account phase variation of a transducer gain over time at the beginning of burst signal.

A publication entitled "RF Linear Power Amplifier Gain Stabilization over Ambient Temperature", Gorbachov, Microwave Journal, December 2005, describes a method for compensating gain variation over ambient temperature for linear WCDMA PA.

All solutions described above are based on intervening into an active bias circuitry of RF transistor to compensate for parameters' deviation due to thermal dependency of PA parameters. As a result, design, tuning and calibration procedures require multiple iterations and the overall process becomes very complicated.

Accordingly, there is a need in the art to address the problem of dynamic EVM over the entire burst duration. That is, there is a need in the art for RF power amplifiers that provide high linearity during RF burst signals in WiFi applications.

SUMMARY OF THE INVENTION

The present invention teaches certain benefits in construction and use which give rise to the objectives described below.

A radio frequency (RF) power amplifier (PA) for amplifying an RF signal between a source node and an output node, the RF PA comprising a silicon substrate with a complementary metal oxide semiconductor (CMOS) N-type transistor with a source region and a drain region fabricated therein, wherein the source region comprises the source node of the RF PA and the drain region comprises the output node of the RF PA; a planar resistor fabricated on the surface of the silicon substrate proximal to the drain region of the N-type transistor, wherein the resistor provides a thermal source for heating the RF PA; and a control circuit providing thermal heating to the RF PA by providing power to the planar resistor during RF signal bursts wherein the added thermal heating compensates transient heating within the transistor and results in a linear power amplification operation.

A primary objective of the present invention is to provide a RF PA having advantages not taught by the prior art.

Other features and advantages of the present disclosure will become apparent from the following more detailed description, taken in conjunction with the accompanying drawings, which illustrate, by way of example, the principles of the disclosure.

BRIEF DESCRIPTION OF THE DRAWINGS

The advantages and features of the present disclosure will become better understood with reference to the following more detailed description taken in conjunction with the accompanying drawings in which.

DETAILED DESCRIPTION OF THE INVENTION

Aspects and implementations of the present disclosure are directed towards a radio frequency power amplifier. The radio frequency power amplifier includes complementary metal oxide semiconductor and a planar resistor fabricated on a silicon substrate, which is accompanied by a control circuit. The control circuit provides thermal heating to the radio frequency power amplifier by providing power to the planar resistor during RF signal bursts. The added thermal heating compensates for transient heating within the transistor, thus resulting in a linear power amplification operation.

As described above, a power amplifier used in a wireless local area network also referred to as a Wi-Fi (IEEE 802.11) system is required to have a linear performance. Transients such as current, voltage, power, gain, phase, etc., at ramping signal edges, result in dynamic EVM. Furthermore, transients result from dynamically switching currents and voltages as well as thermal properties of transistors inside a power amplifier circuitry.

Also as described above, in recent WiFi systems implementing 802.11n and/or 802.11ac, the more substantial thermal issues along with higher transmit power levels complicate dynamic EVM compensation circuits. Circuits fabricated with GaAs semiconductor material are understood to be more prone to transients and dynamic EVM deterioration at different burst conditions.

Existing technologies provide solutions such that design, tuning and calibration procedures require multiple iterations and overall processes become complex.

The present disclosure focuses on compensating parameters' deviations due to thermal effects in radio frequency transistors by applying independent pre-heating circuitry. The preheating circuitry includes a heating resistor. Heating resistors of various resistance and various types may be used. A direct current (also referred to as "DC") or a voltage applied to the heating resistor is completely decoupled from an active radio frequency transistor biasing circuitry, which significantly mitigates design, tuning and calibration procedures for a highly linear radio frequency complementary metal oxide semiconductor power amplifier operating in bursts modes. This solution is not limited to Wi-Fi systems, but may also be utilized in other wireless applications as well.

The present disclosure may be implemented in open-loop or closed-loop control circuits to compensate radio frequency power amplifier thermal deviations, as a transistor and a heating resistor used in a power amplifier can have different thermal properties. For example, a power amplifier may heat up to a temperature higher than an average temperature of the power amplifier causing a thermal deviation. In another example, a power amplifier may heat up to a temperature lower than an average temperature of the power amplifier also causing a thermal deviation.

Figure 1:
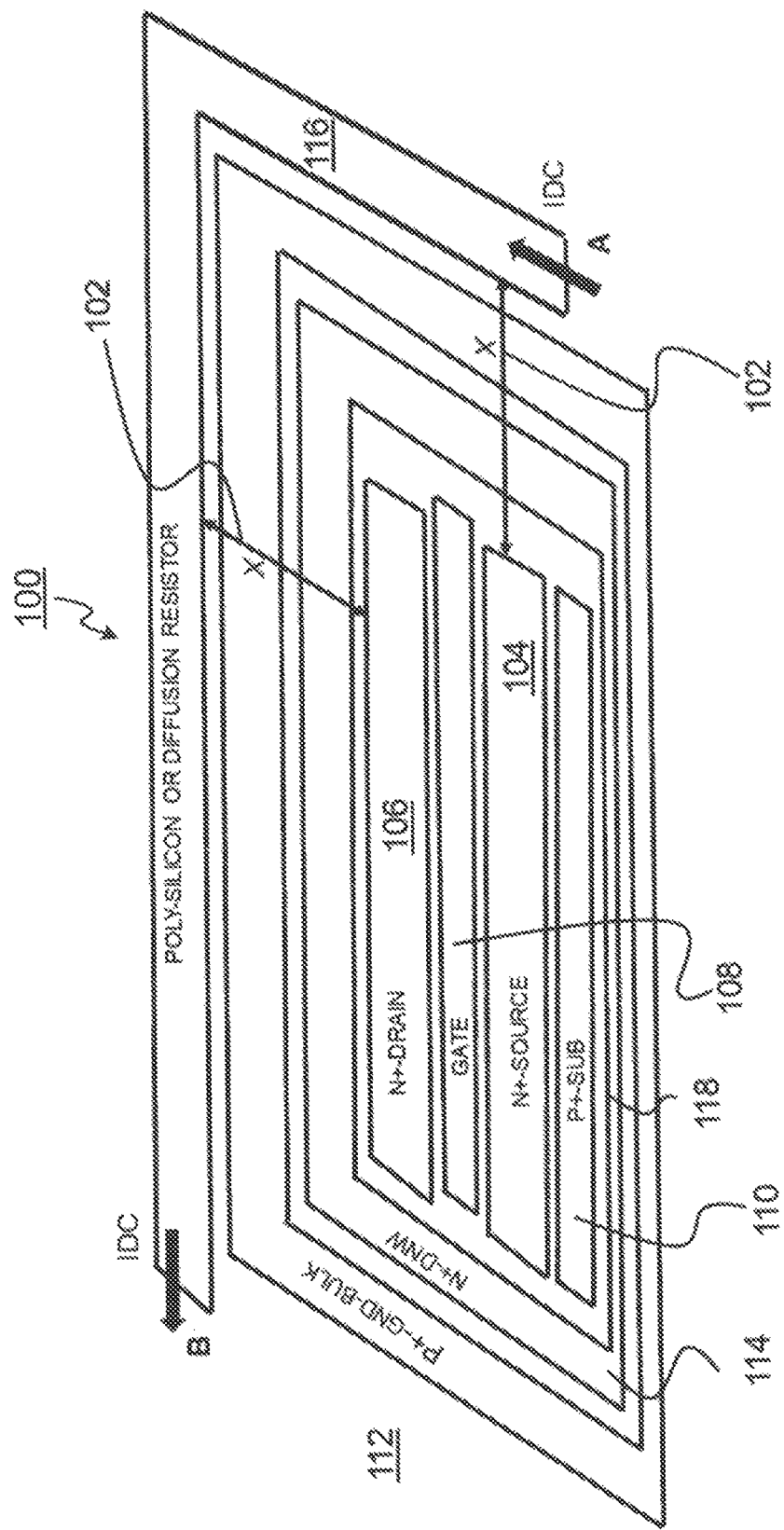
FIG. 1 is a simplified plane view of a first implementation of a radio frequency power amplifier, in accordance with the present disclosure.

FIG. 1 is a simplified plane view of a first implementation of a radio frequency power amplifier (also referred to as "RF PA"). RF PA 100 includes a silicon substrate with a complementary metal oxide semiconductor (CMOS) N-type transistor 118 with a source region 104 and a drain region 106 fabricated therein. A gate 108 is also fabricated in the silicon substrate. The source region 104 includes a source node (not depicted) of the RF PA 100 and the drain region 106 includes an output node (not depicted) of the RF PA 100. The CMOS transistor 118 includes a substrate contact P+-sub 110 for a power amplifying operation. The CMOS transistor 118 is placed in a deep-N-well 114 for electrical isolation from the silicon substrate. The deep-N-well 114 is surrounded by bulk contacts 112 connecting to the silicon substrate.

The RF PA 100 further includes a planar resistor 116 fabricated on the surface of the silicon substrate proximal at a distance X 102 to the drain region and/or the source region of the CMOS N-Type transistor 118, and a control circuit (not depicted).

In an implementation, the control circuit may include a negative channel metal oxide semiconductor (NMOS) transistor with a source, a drain, and a gate, configured as an electrical switch, and a control block configured to generate a voltage level to set an electrical current through the NMOS transistor. The control circuit may further include an input, a buffer, a resistor, and a switch. The input is configured to couple operatively to an RF PA and the control block is configured to transmit an electrical signal that powers the RF PA. A first end of the resistor is operatively coupled to the buffer and a second end of the resistor is operatively coupled to the drain of the NMOS transistor. The switch is operatively coupled to the control block and the gate of the NMOS transistor. In response to the electrical signal enabling the control block, a bias voltage is provided to the gate of the NMOS transistor via the switch and the NMOS transistor is configured to transmit an electrical current from the buffer and the resistor as the electrical current flows from the drain to the source of the NMOS transistor.

By applying particular voltages to the drain region 106 and the gate 108 of the CMOS transistor 118 and operably coupling to the control circuit, the CMOS transistor 118 operates in DC and a radio frequency (also referred to as "RF"). For example, for 0.18 μm CMOS technology, a drain voltage may be between 1.5V to 3.6V and a gate voltage may be between 0.5V to 1.0V. The resistor 116 provides a thermal source for heating the RF PA 100 and the control circuit provides the thermal heating to the RF PA 100 by providing power to the resistor 116 via applying a voltage between point A and B of the resistor 116 during RF signal bursts. In response to applying the voltage, a current starts flowing through the resistor 116 and the resistor 116 starts raising its own temperature, in accordance to Joule's law. Joule's law is a principal in which heat produced by an electric current i flowing through a resistance R for a time t is proportional to $i^2Rt$. Heat generated by the resistor 116 starts dissipating through surrounding areas of the resistor 116 and the temperature of the CMOS transistor 118 in turn starts to rise.

The added thermal heating compensates transient heating within the CMOS transistor 118 and results in a linear power amplification operation. Linear performance occurs when the output of the RF power amplifier is proportional to its input, but the output delivers additional power into a load without altering the content of the input. Change of a temperature of the CMOS transistor 118 results in changing a DC and an RF performance. For a CMOS process, a transconductance (equivalent to gain) is reduced with a temperature increase. At the same time, a DC may be changed while it is dependent on a bias circuitry. To get to a constant or almost constant RF amplifier stage, a DC between the drain region 106 and the source region 104 is increased with the increased temperature. Due to completely separated DC paths for the CMOS transistor 118 and the resistor 116, applying a voltage to the resistor 116 only influences a temperature dependence and does not intervene with any DC parameters of the CMOS resistor 118. This property makes the resistor 116 function as a local temperature source. A different voltage applied to the resistor 116 results in a different temperature of the CMOS transistor 118. A temperature of the CMOS transistor 118 increases as a higher voltage is applied to the resistor 116.

In an implementation, the distance X 102 in FIG. 1 may be between a few μm to several tens of μm for 0.18 μm CMOS technology. In an implementation, the resistor 104 may be a polysilicon resistor formed on a silicon dioxide layer over the silicon substrate. In an implementation, the resistor 104 may be one of a P-type or N-type diffused region at the surface of the silicon substrate. In an implementation, the CMOS transistor 118 and the resistor 104 may be powered using separate circuitry.

Figure 2:
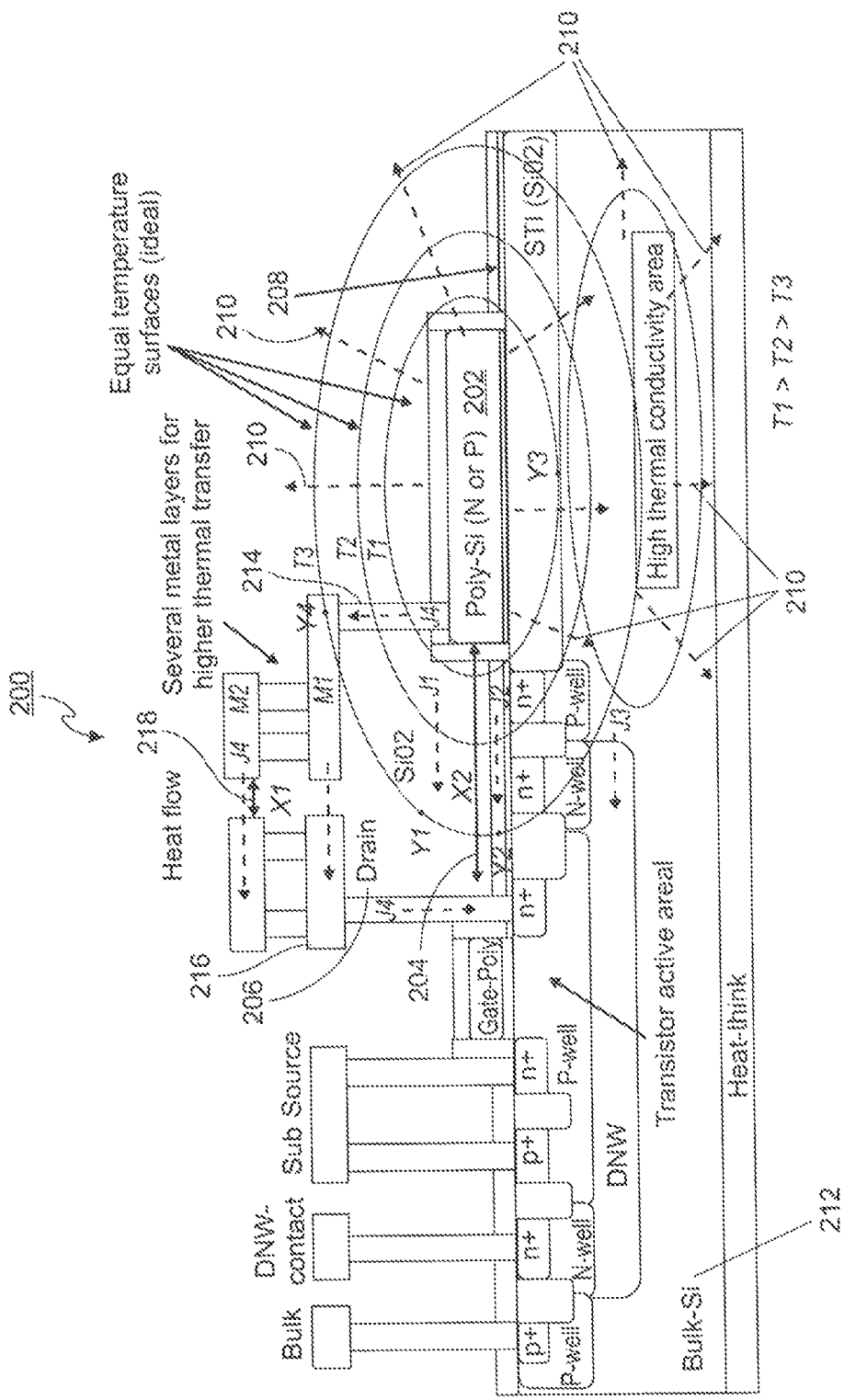
FIG. 2 is a first exemplary cross section view of the first implementation of a radio frequency power amplifier, in accordance with the present disclosure.

FIG. 2 is a first exemplary cross section view of the first implementation of an RF PA 200. The RF PA 200 is an exemplary implementation with a polysilicon resistor 202 as a heating resistor in a hot area. In an implementation, the resistor 202 may be one of a P-type or an N-type polysilicon resistor via doping of either P-type or N-type, formed between dielectric layers of a silicon substrate. The resistor 202 is deposited on a dielectric layer shallow trench isolation that may be made from a silicon dioxide. The silicon dioxide thermal conductivity is two orders lower than a bulk silicon substrate 212. Doping dose as well as shape and overall size of the resistor 202 affects a resistance value. The resistor 202 is placed at a minimal distance X2 (204) from a transistor drain 206 allowed by particular technology design rules. For example, the distance X2 (204) may range between a few μm to several tens of μm for 0.18 μm CMOS technology.

A top of polysilicon resistor is covered by a thin layer of a stop layer 208 dielectric, which covers an active transistor area (source, drain, and gate, etc.) as well. In an implementation, a silicon nitride may be used as the stop layer 208 and its thermal conductivity is one order of magnitude higher than a silicon dioxide and one order of magnitude lower than a bulk silicon 212. In the depicted implementation, the stop layer 208 is constructed of silicon nitride, $Si_3N_4$. Multiple dielectric layers (not depicted) placed above the silicon nitride may be based on a silicon dioxide with associated low thermal conductivity, resulting in the resistor 202 being buried within dielectric layers with low thermal conductivity. In response to a voltage applied to the resistor 202, the resistor 202 starts raising its temperature due to Joule's law. The hottest area of the circuit corresponds to a body of the resistor 202. Heat starts dissipating in surrounding areas of the resistor 202 in accordance with concentric ellipsoids which are a simplified representation for uniform surrounding dielectric layers. Heat transfer direction is shown by all of the dashed arrow lines 210. In an implementation, temperature distribution may differ from the ellipsoid. For example, the temperature of point Y2 may be higher than point Y1 due to higher thermal conductivity for a silicon nitride than for a silicon dioxide. Point Y3 denotes a position indicative of when heat transfer front is reaching a surface of the bulk silicon 212.

Starting from point Y3, because heat transfer is omnidirectional, the majority of heat in the bulk silicon 212 substrate travels away from the active transistor area while only a small portion of it is directed to the active transistor area depicted by J3. This results in the majority of the heat energy being wasted as the heat energy reaches the bulk silicon 212. Using a thick shallow trench isolation dielectric layer and covering as much surrounding area as possible and/or placing the resistor 202 on higher dielectric layers may reduce the heat waste through the bulk silicon 212. Some heat energy may be wasted in dielectric layers at the right hemisphere of the ellipsoids. To reduce heat waste through dielectric layers, additional metal layers may be used via a contact 214 that operably couples the resistor 202 to at least a metal trace M1. In an implementation, the contact 214 may be based on a tungsten and the metal trace M1 may be constructed using aluminium. The metal layers are placed at a distance X1 (218) to a metal electrode 216 of the transistor drain 206. The distance X1 (218) may be one order of magnitude shorter than the distance X2 (204) according to the standard semiconductor process design rule, resulting an efficient heat transfer between the distance X1 (218) of silicon dioxide. The smaller distance X1 (218) is, the more efficient heat transfer from the resistor 202 to the active transistor area is. In another implementation, the metal layers may be placed proximal to a metal electrode of the other part of an active transistor area such as a source.

A tungsten thermal conductivity is 10% higher and an aluminium conductivity is 50% higher than the bulk silicon 212. The metal layers create an additional thermal path flow from the resistor 202 to the active transistor area denoted as J4, which may have a significant contribution to overall transistor temperature rise. In the depicted implementation, a temperature at point Y4 is higher than a temperature at point Y1. The thermal conductivity of the bulk silicon 212 is reduced two times with changing a temperature of the transistor from −40° C. to +85° C. while the thermal conductivity of the tungsten is reduced by just 50% for the same conditions and the thermal conductivity of the aluminium is not changed. This results in thermal waste reduction through the bulk silicon 212 with a temperature increase of the transistor. In other implementation, several metal layers may be used to enhance a heat flow contribution.

In an implementation, the resistor 202 may be covered with a silicon nitride layer. The silicon nitride layer may also lie over the transistor drain 206 and couple thermal energy between the resistor 202 and the transistor drain 206. In another implementation, the resistor 202 is covered in part with at least one metal layer, which is in proximity to the transistor drain 206 and is configured to couple thermal energy between the resistor 202 and the transistor drain 206. For example, by placing metal layers proximal to the electrodes 216 of the transistor drain 206 via connect 214, thermal energy is transferred between the resistor 202 and the transistor drain 206.

Figure 3:
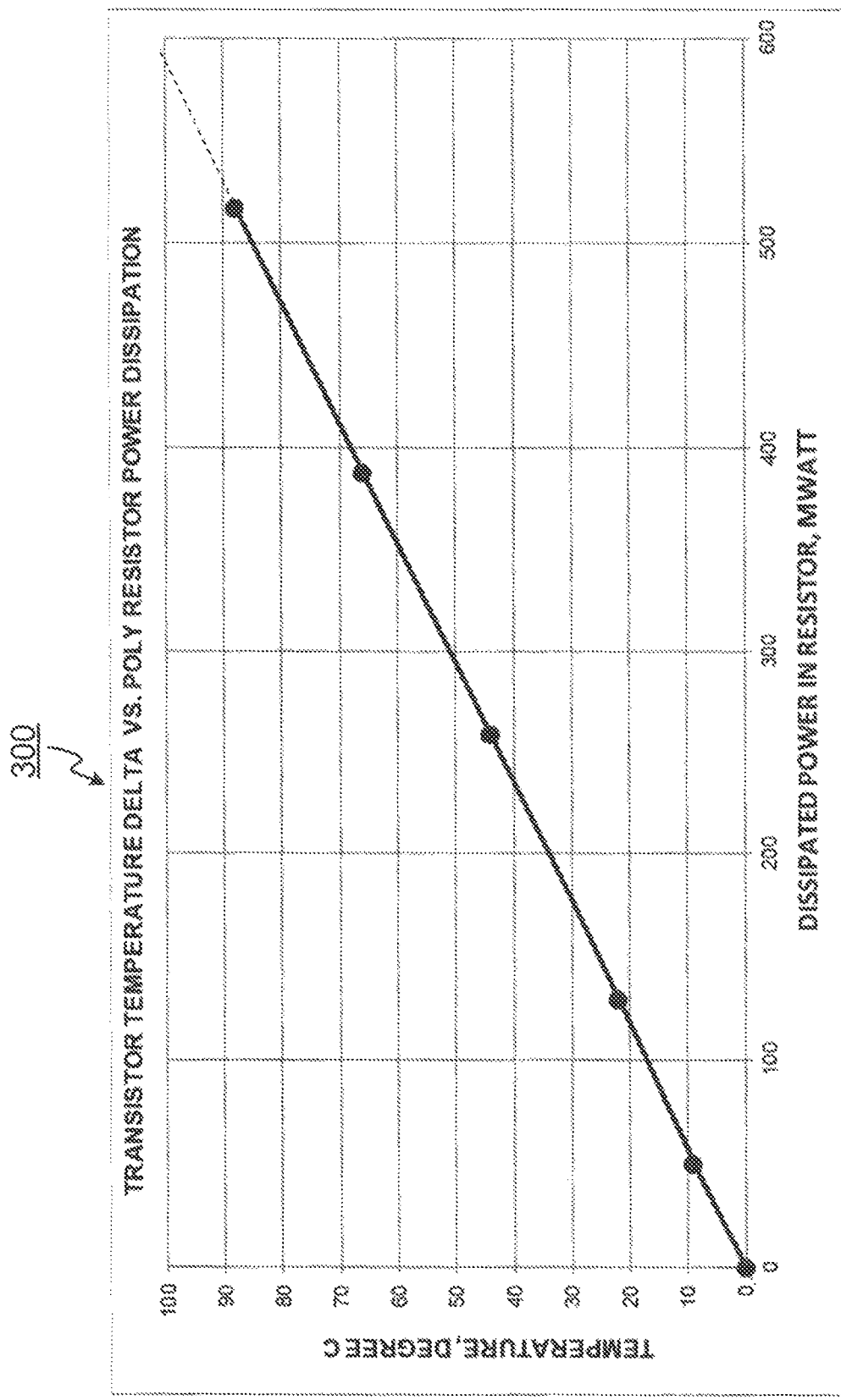
FIG. 3 is a graph showing a transistor temperature delta of the first implementation of a radio frequency power amplifier versus a poly-silicon heating resistor power dissipation, in accordance with the present disclosure.
Figure 4:
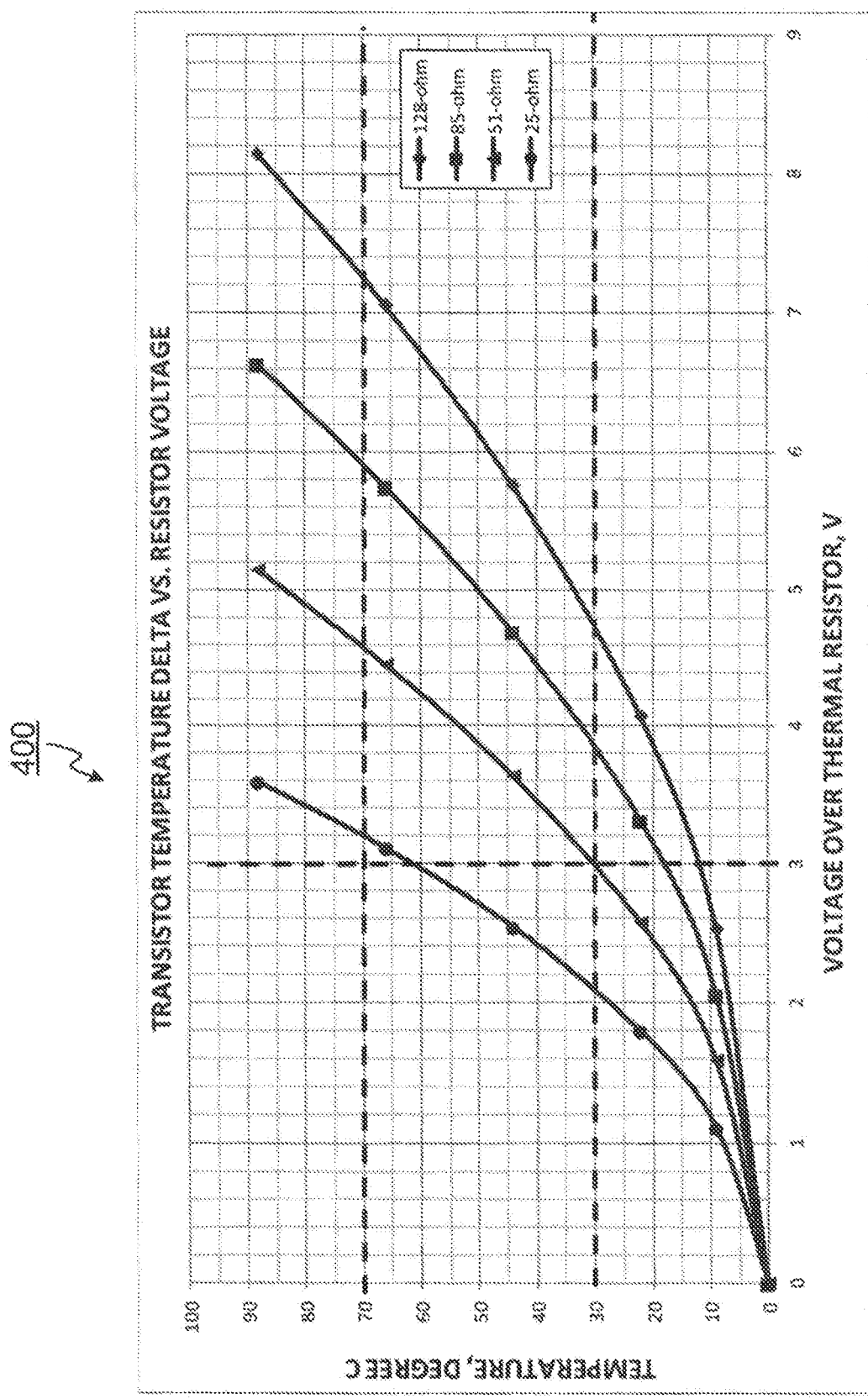
FIG. 4 is a graph showing a transistor temperature of the first implementation of a radio frequency power amplifier versus a voltage over a poly-silicon heating resistor, in accordance with the present disclosure.
Figure 5:
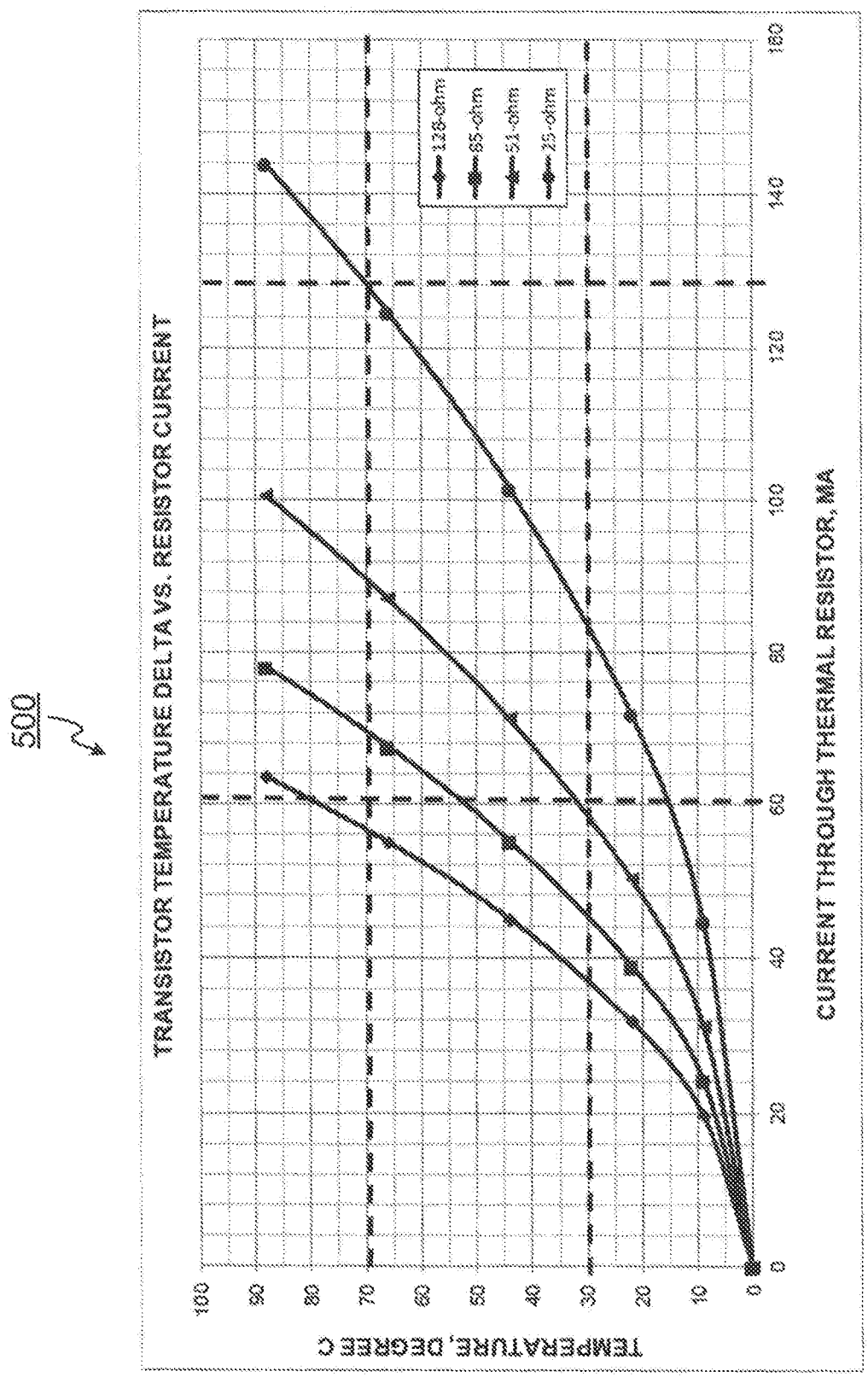
FIG. 5 is a graph showing a transistor temperature of the first implementation of a radio frequency power amplifier versus a current through a poly-silicon heating resistor.

FIG. 3, FIG. 4, and FIG. 5 are plotted test results with a negative channel metal oxide semiconductor (NMOS) transistor in deep-N-well with overall gate length of 1 mm based on 0.18 μm CMOS technology. The transistor is surrounded by an 85 ohm polysilicon resistor.

FIG. 3 is a graph 300 showing a transistor temperature delta of the first implementation of an RF PA versus a poly-silicon heating resistor power dissipation. In FIG. 3, graph 300 depicts the rise of the temperature of the transistor (temperature rise) by applying particular voltage levels to the polysilicon resistor. The graph 300 shows a linear relationship between temperature rise and resistor dissipated power.

FIG. 4 is a graph 400 showing a transistor temperature of the first implementation of an RF PA versus a voltage over a poly-silicon heating resistor. Graph 400 depicts required voltage levels over the heating resistor that are simulated for different resistor values (128 ohms, 85 ohms, 51 ohms, and 25 ohms). Plots of graph 400 show that voltages between 3V to 5V used in a modern RF integrated circuit (RFIC) application easily raise a temperature of the NMOS transistor.

FIG. 5 is a graph 500 showing a transistor temperature of the first implementation of an RF PA versus a current through a poly-silicon heating resistor. Plots of graph 500 show simulation results for required currents through the heating resistor with different resistor values (128 ohms, 85 ohms, 51 ohms, and 25 ohms). The graph 500 shows that test results are within an RFIC current consumption budget.

Figure 6:
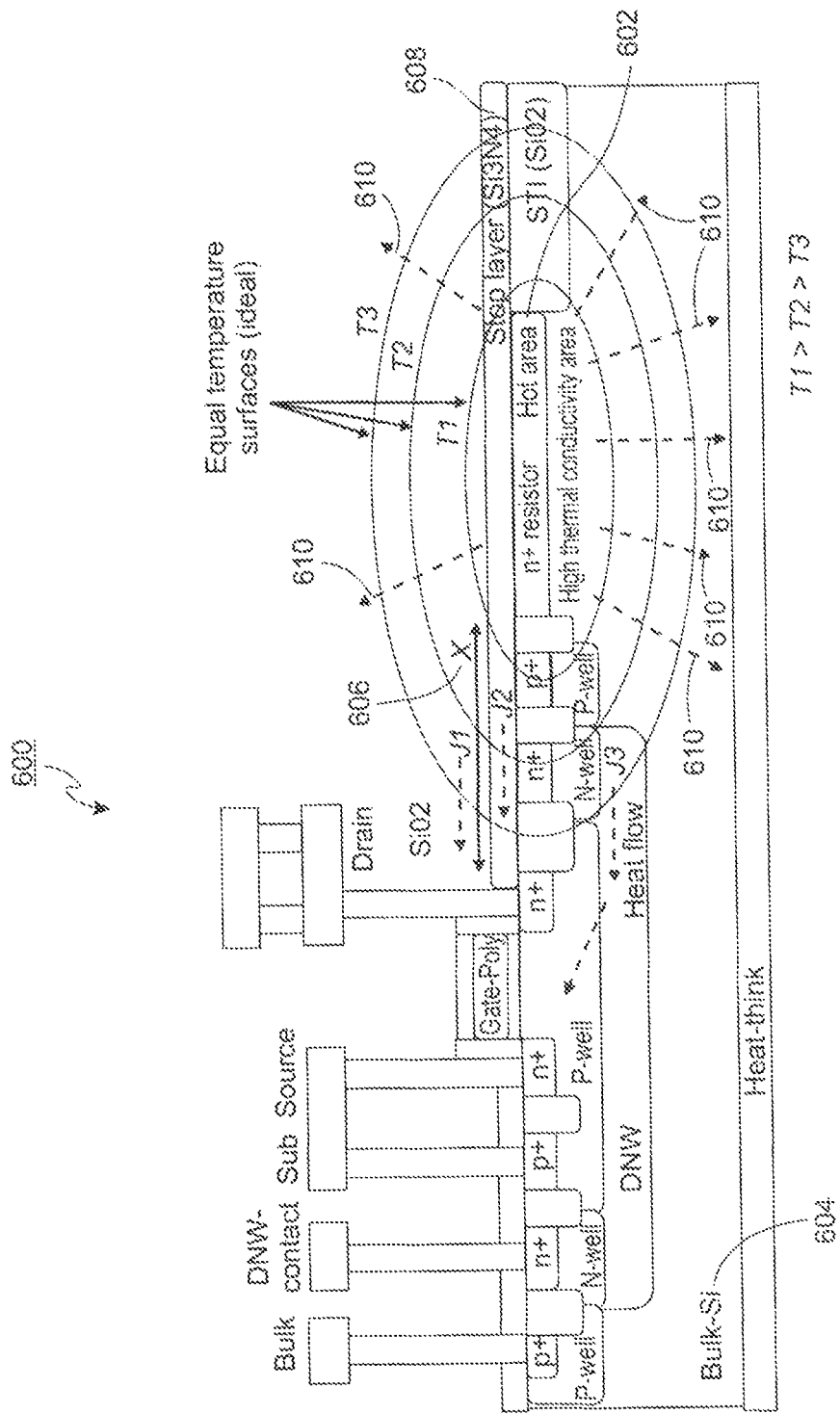
FIG. 6 is a second exemplary cross section view of a first implementation of a radio frequency power amplifier, in accordance with the present disclosure.

FIG. 6 is a second exemplary cross section view of a first implementation of an RF PA 600. The RF PA 600 is an exemplary implementation of the present disclosure with a negative metal-oxide-semiconductor field-effect transistor (NMOSFET) with an N-type diffusion resistor 602 as a heating resistor. In an implementation, the resistor 602 may be a P-type diffusion resistor placed inside N-well. However, an N-type resistor is preferred in cases when a positive voltage is applied for heating purposes due to a reverse biased diode between an N-diffusion and a P-type bulk silicon substrate naturally creates a DC isolation between different parts of an integrated circuit of an RF PA.

The resistor 602 is embedded into a body of a bulk silicon substrate 604. Doping dose of N-type or P-type as well as shape and overall size of the resistor 602 affects a resistance value. Contacts for voltage supply to the resistor 602 is not depicted. The resistor 602 is placed at a minimal distance X 606 from an active transistor area (source, drain, gate, etc.) allowed by particular technology design rules. For example, the distance X 606 may be between a few μm to several tens of μm for 0.18 μm CMOS technology. A top of the resistor 602 is covered by a thin layer of a stop layer dielectric 608, which is made of a silicon nitride. Multiple dielectric layers (not depicted) placed above the stop layer 608 are based on a silicon dioxide with associated low thermal conductivity, which results in the resistor 602 being buried within the dielectric layers with low thermal conductivity. In response to a voltage applied to the resistor 602, the resistor 602 starts raising its temperature due to Joule's law. The hottest area of the circuit corresponds to a body of the resistor 602. Heat starts dissipating in surrounding area in accordance with concentric ellipsoids which are a simplified representation for uniform surrounding dielectric layers. Heat transfer direction is shown by all of the dashed arrow lines 610. Heat transfer processes of the RF PA 600 in FIG. 6 are similar to those of the RF PA 200 in FIG. 2. In another implementation, RF PA 600 may be implemented with an additional heat transfer path through metal layers, as in RF PA 200 of FIG. 2.

Although heat transfer from the resistor 602 to the active transistor area may not be as efficient as the RF PA 200 of FIG. 2 due to large amounts of waste heat through the silicon substrate, RF PA 600 benefits from higher possible speeds of heating up and cooling down of a transistor structure while applying a voltage to or removing a voltage from the resistor 602. By contrast, a polysilicon resistor of RF PA 200 of FIG. 2, which is surrounded by only dielectric layers with low thermal conductivity, has longer a time constant compared to a highly thermally conductive silicon substrate.

Figure 7:
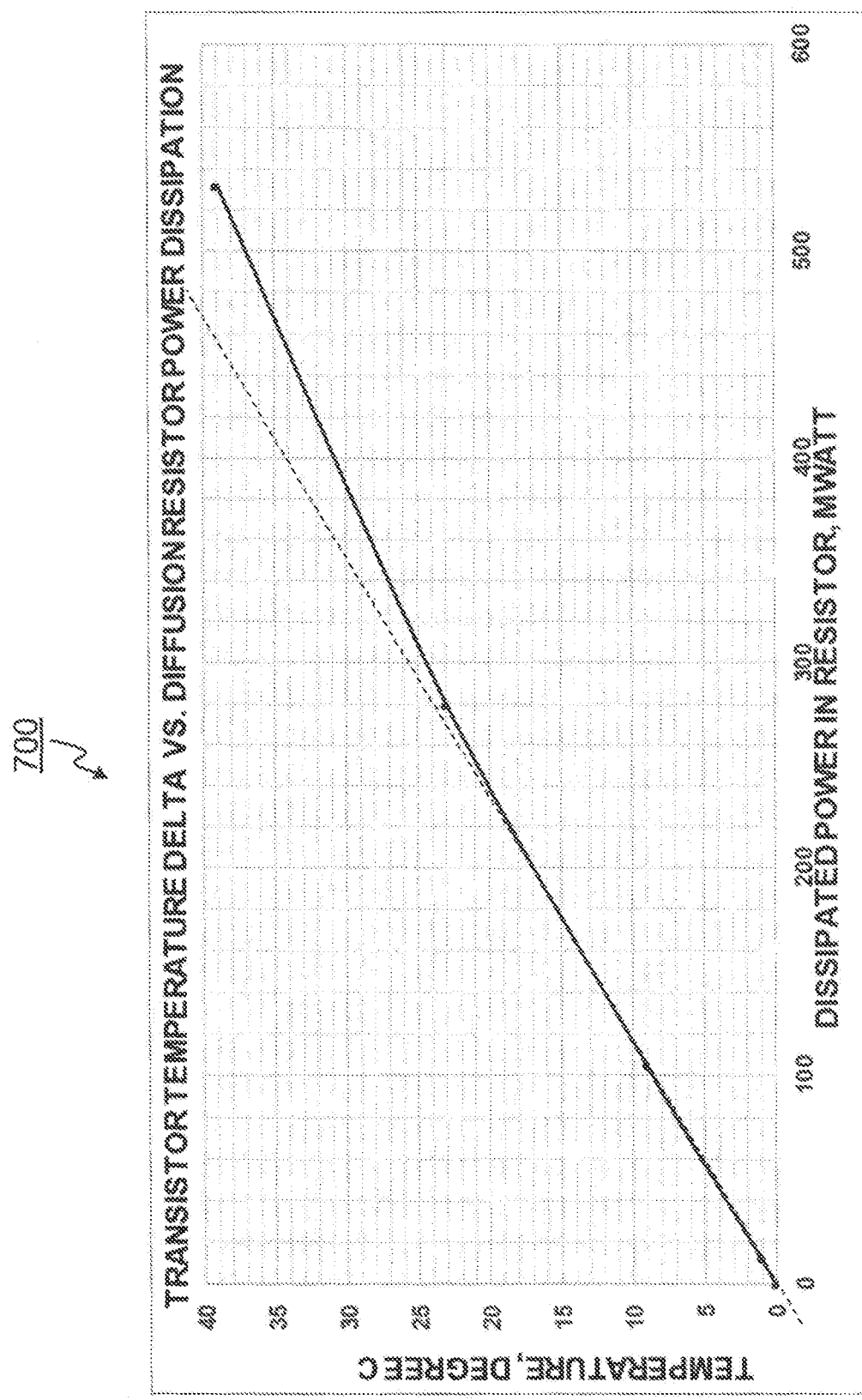
FIG. 7 is a graph showing a transistor temperature delta of the first implementation of a radio frequency power amplifier versus a diffusion heating resistor power dissipation, in accordance with the present disclosure.

FIG. 7 is a graph 700 showing a transistor temperature delta of the first implementation of an RF PA versus a diffusion heating resistor power dissipation. A negative channel metal oxide semiconductor (NMOS) transistor in deep-N-well with overall gate length of 1 mm based on 0.18 μm CMOS technology is used to test and plot graph 700. The transistor is surrounded by an 85 ohm N-type of diffusion resistor. The graph 700 shows temperature rise of the transistor by applying particular voltage levels to the diffusion resistor. The graph 700 shows a plot close to a linear relationship between temperature rise and resistor dissipated power A comparison between the graph 700 and the graph 300 of FIG. 3 shows that the diffusion resistor requires about two times more electrical energy to reach the same temperature rise for the NMOS transistor.

Figure 8:
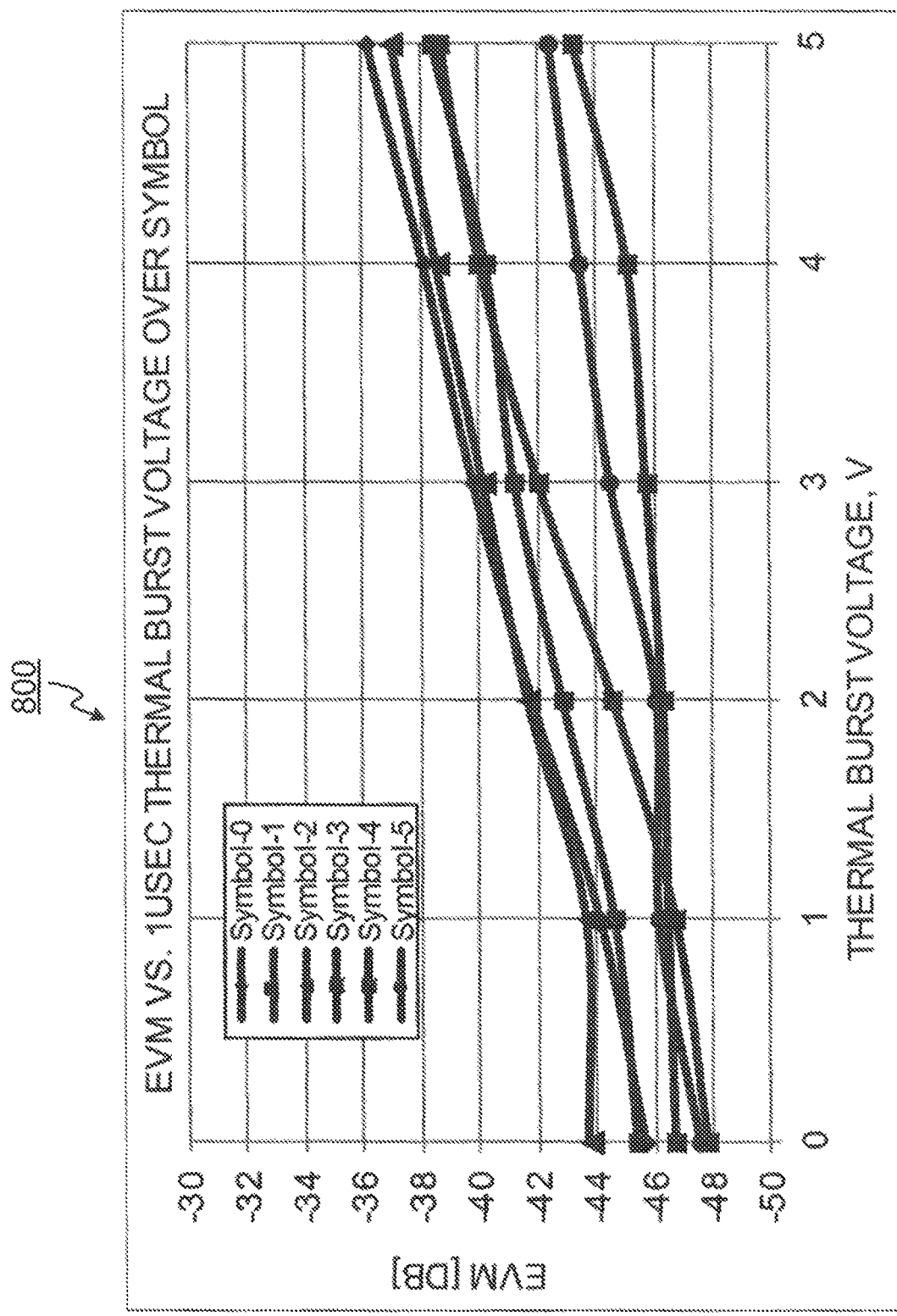
FIG. 8 is a graph showing an error vector magnitude of a single-stage power amplifier based on the first implementation of a radio frequency power amplifier versus a 1 μsec thermal burst voltage, in accordance with the present disclosure.
Figure 9:
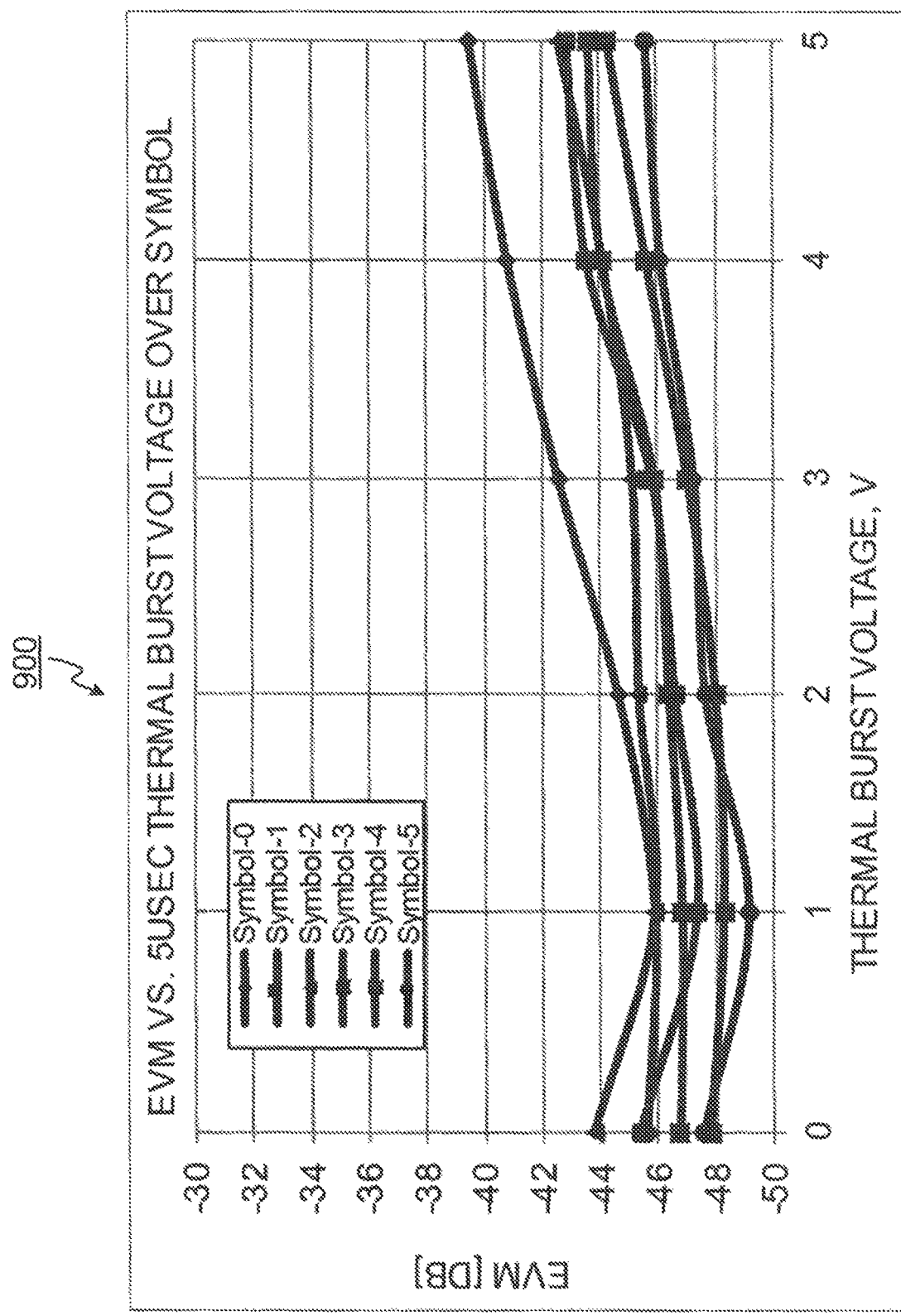
FIG. 9 is a graph showing an error vector magnitude of a single-stage power amplifier based on the first implementation of a radio frequency power amplifier versus a 5 μsec thermal burst voltage, in accordance with the present disclosure.

FIG. 8 and FIG. 9 each depict respect graphs of error vector magnitudes versus different thermal burst voltages. FIG. 8 is a graph 800 showing an error vector magnitude of a single-stage power amplifier based on the first implementation of an RF PA versus a 1 μsec thermal burst voltage. FIG. 9 is a graph 900 showing an error vector magnitude of a single-stage power amplifier based on the first implementation of an RF PA versus a 5 μsec thermal burst voltage. A single-stage power amplifier based on the NMOS transistor of FIG. 7 is used to test and to plot graph 800 and graph 900. The power amplifier has been tuned for highly linear Wi-Fi (IEEE 802.11) application operating at 2.4 GHz frequency band. A heating resistor effectiveness has been verified by applying a short heating burst voltage with a different heating burst width. Strong dependence of an error vector magnitude over a heating burst voltage is seen on the graph 800 and it shows that even very short heating burst of 1 μsec is effectively changing the temperature of an active transistor area. As the graph 800 shows, RF PA 600 of FIG. 6 may be effectively used for very fast heating and controlling parameters required for Wi-Fi (IEEE 802.11) and other linear applications. When comparing 5 μsec thermal burst voltage test of the graph 900 with the 1 μsec thermal burst voltage test of the graph 800, it can be seen that a shorter heating burst is as effective as a longer heating burst.

Figure 10:
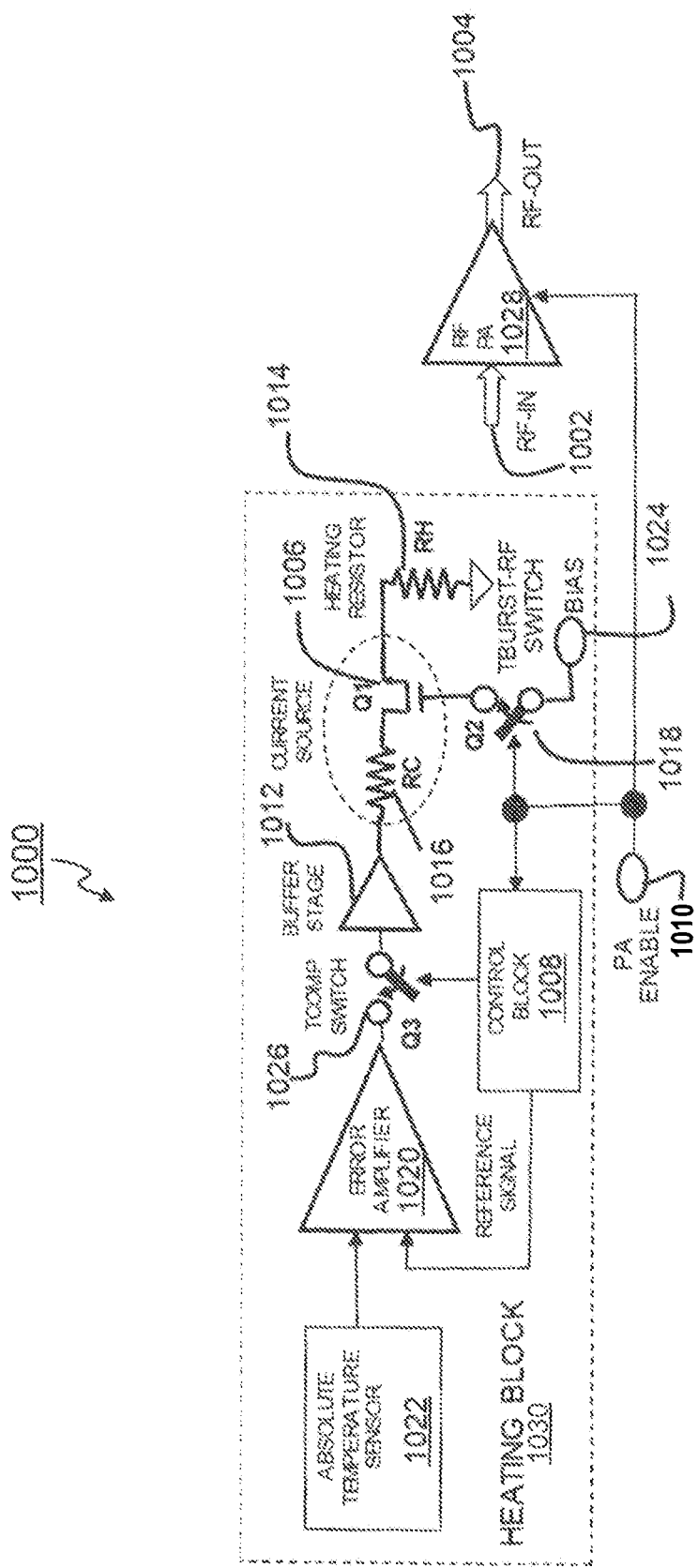
FIG. 10 is a block diagram of the first implementation of a radio frequency power amplifier with an associated radio frequency matching networks and a bias block, in accordance with the present disclosure.

FIG. 10 is a block diagram of the first implementation of an RF PA 1000 with associated RF matching networks and a bias block. RF PA 1000 includes a complementary metal oxide semiconductor (CMOS) N-type transistor and associated RF matching networks as well as a bias block to set an operating DC current value through a complementary metal oxide semiconductor (CMOS) N-type transistor. The RF PA 1000 includes a heating block 1030. The RF PA 1000 includes a silicon substrate with CMOS N-type transistor 1028 with a source region (not depicted) and a drain region (not depicted) fabricated therein. The source region includes the source node 1002 of the RF PA 1000 and the drain region includes the output node 1004 of the RF PA 1000. The RF PA 1000 further includes a negative channel metal oxide semiconductor (NMOS) transistor 1006, a control block 1008, an input 1010, a buffer 1012, a first resistor 1014, a second resistor 1016, a switch 1018, an error amplifier 1020, an absolute temperature sensor 1022, and a temperature (Tcomp) compare switch 1026. The NMOS transistor 1006 with a source, a drain, and a gate, is configured as an electrical switch. The control block 1008 is configured to generate a voltage level to set an electrical current through the NMOS transistor 1006. The input 1010 is configured to couple operatively to the RF PA 1000 and the control block 1008 to transmit an electrical signal that powers the RF PA 1000. The first resistor 1014 operatively coupled to the source of the NMOS transistor 1006. The first resistor 1014 is fabricated on a surface of the silicon substrate proximal to the drain region of the CMOS N type transistor 1028 and the first resistor 1014 provides a thermal source for heating the RF PA 1000. The CMOS transistor 1028 is surrounded by the first resistor 1014. A first end of the second resistor 1016 is operatively coupled to the buffer 1012 and a second end of the second resistor 1016 is operatively coupled to the drain of the NMOS transistor 1006. The switch 1018 is operatively coupled to the control block 1008 and the gate of the NMOS transistor 1006. In response to the electrical signal powering the control block 1008, a bias voltage 1024 is provided to the gate of the NMOS transistor 1006 via the switch 1018 and the NMOS transistor 1006 is configured to transmit an electrical current from the buffer 1012 and the second resistor 1016, as the electrical current flows from the drain to the source of the NMOS transistor 1006.

The absolute temperature sensor 1022 measures a temperature on a semiconductor die of the CMOS transistor 1028 at a far distance from an active area of the CMOS transistor 1028 and converts a measured temperature to a particular voltage level. For example, the absolute temperature sensor 1022 may be placed at a location farthest away from the CMOS transistor 1028 in a power amplifier integrated circuit and generate a voltage in accordance with a measured temperature. The control block 1008 generates a proper voltage level required to set a DC flow through the NMOS transistor 1006. A voltage generated from the absolute temperature sensor 1022 is compared with a voltage generated by the control block 1008 by means of the error amplifier 1020. A voltage of an error signal is proportional to a difference between the voltage generated by the absolute temperature sensor 1022 and the voltage generated by the control block 1008. Then, the voltage of an error signal is applied via the buffer 1012 and the second resistor 1016 to the NMOS transistor 1006, transmit an electrical current in DC through the NMOS transistor. The second resistor 1016 and the NMOS transistor 1006 are a current source and provides a particular current to the first resistor 1014 that acts as a heating resistor. For example, heat generated by the first resistor 1014 is proportional to a current transmitted by the current source. In an ideal case, the current source may provide a constant current to a heating resistor. However, in other implementations, a heating resistor may have a positive or a negative temperature coefficient, thus, an overall current level and/or a burst width may be adjusted. In an implementation, a current source may have a different configuration than depicted in FIG. 10.

Figure 11:
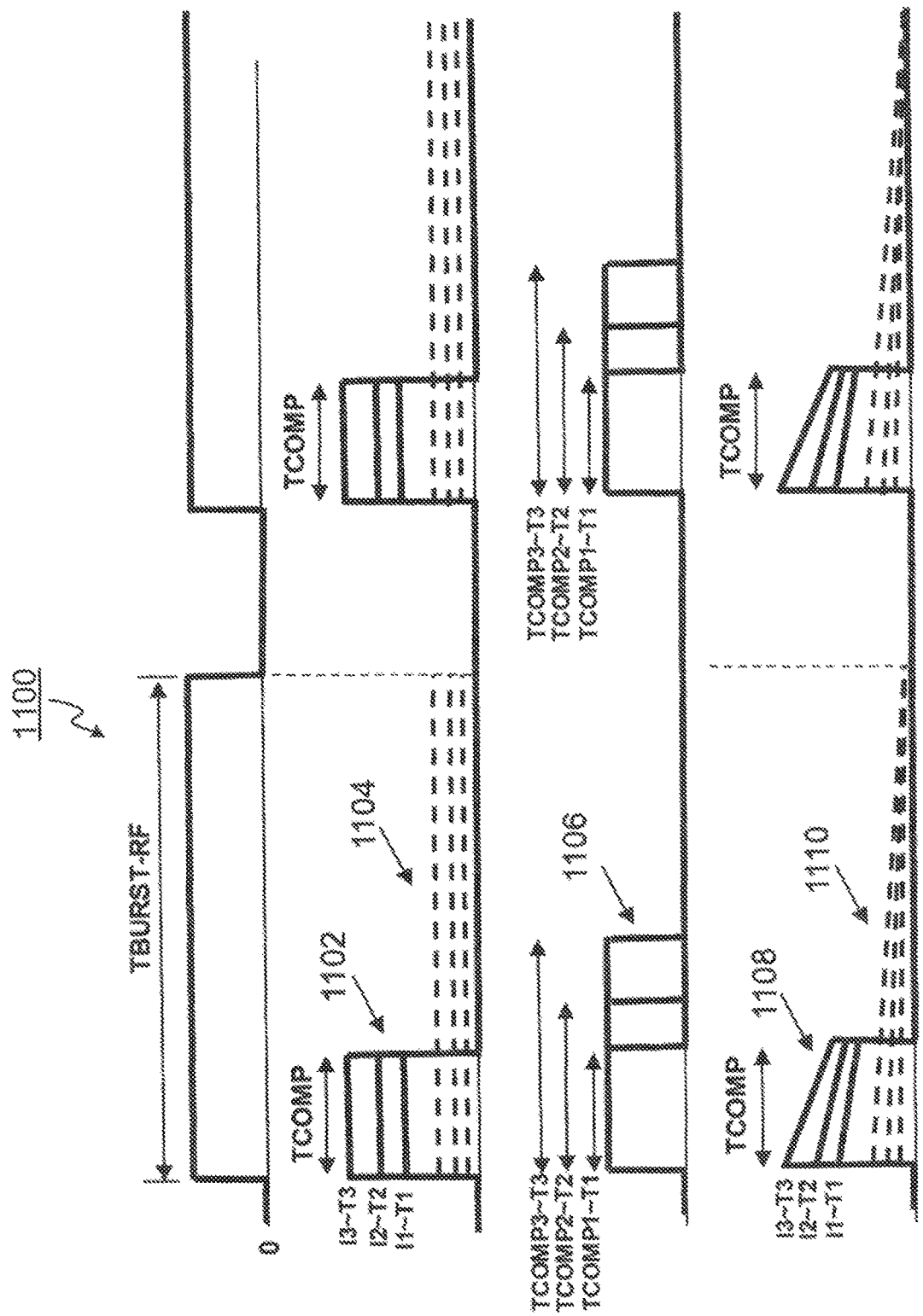
FIG. 11 depicts waveforms of operation modes of the first implementation of a radio frequency power amplifier with an associated radio frequency matching networks and a bias block, in accordance with the present disclosure.

FIG. 11 depicts waveforms 1100 of operation modes of the first implementation of an RF PA with an associated RF matching network and a bias block depicted in FIG. 10. Referring to FIG. 10, the input 110 activates the NMOS transistor 1006 and allows the NMOS transistor 1006 to transmit a DC and sets a thermal burst and RF (Tburst-RF) time interval at which an RF signal is applied to the RF PA 1028 via the source node 1002. The input 110 also activates the NMOS transistor 1006 by operatively coupling the bias voltage 1024 to the gate of the NMOS transistor 1006 via the switch 1018, and the NMOS transistor 1006 transmits a DC to the first resistor 1014. In response to the NMOS transistor 1006 being deactivated, the gate of the NMOS transistor 1006 is operably coupled to a ground. A temperature comparison (Tcomp) heating time interval is provided by the control block 1008 and allows an error signal to be applied to the first resistor 1014 by means of the Tcomp switch 1026. At an initial stage of a power amplifier design, the Tcomp heating time interval and DC levels are defined based on particular requirements such as an error vector magnitude (EVM), a gain, etc., to be met over an ambient temperature and the Tburst-RF time interval. Then, the control block 1008 provides a mapping of those parameters (EVM, gain, etc.) to operate with a voltage generated by the absolute temperature sensor 1022. Different operating modes may be used to pre-heat the CMOS transistor 1028 at the beginning of an RF burst to compensate for gain and phase change of an amplifier stage due to a different temperature.

Referring again to FIG. 11, there are five operation modes of the RF PA 1000 of FIG. 10 that are shown in waveforms 1100. A waveform 1102 depicts a first operation mode. A DC burst signal at the beginning of an RF burst with a fixed current burst width (Tcomp) and a current amplitude vary according to an ambient temperature.

A waveform 1104 depicts a second operation mode. A DC burst signal corresponds to a full RF burst width where Tcomp and Tburst-RF intervals are equal in width, and a current amplitude varies according to an ambient temperature.

A waveform 1106 depicts a third operation mode. A DC burst with a fixed amplitude starts at the beginning of an RF burst and a current burst width (Tcomp) is adjusted according to an ambient temperature.

A waveform 1108 depicts a fourth operation mode. The fourth operation mode is similar to the first operation mode, but differs because an amplitude of a DC decays across the burst (Tcomp.)

A waveform 1110 depicts a fifth operation mode. The fifth operation mode is similar to the second operation mode, but differs because an amplitude of a DC decays across a burst where Tcomp and Tburst-RF are equal in width.

Figure 12:
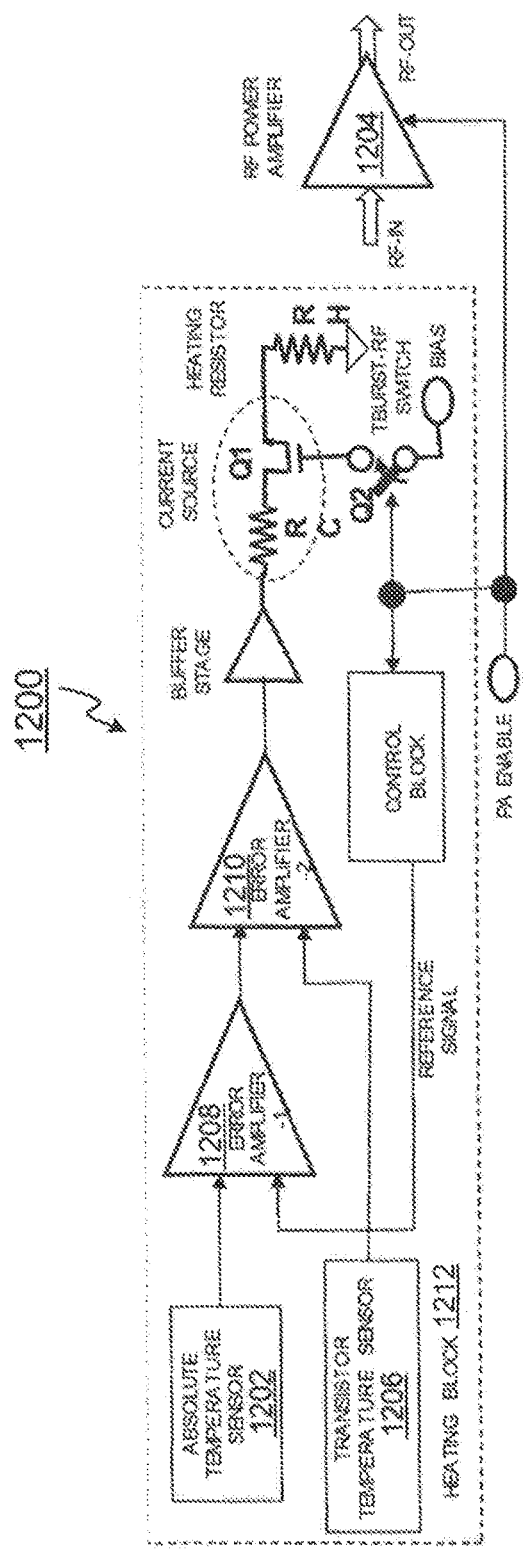
FIG. 12 is a block diagram of a second implementation of a radio frequency power amplifier with an associated radio frequency matching networks and a bias block, in accordance with the present disclosure.

FIG. 12 is a block diagram of a second implementation of an RF PA 1200 with an associated RF matching network and a bias block. RF PA 1200 is an extension of the RF PA 1000 of FIG. 10 and may operate as a closed-loop control circuit solution to compensate a temperature variation over Tburst-RF time interval. RF PA 1200 includes a heating block 1212. An absolute temperature sensor 1202 generates a voltage to compensate an ambient temperature variation of a CMOS transistor 1204. A local transistor temperature sensor 1206 is used to compensate the CMOS transistor 1204 parameters such as an EVM, a gain, etc., over Tburst-RF time interval due to a temperature change over a burst signal, in accordance with Joule's law for heating of the CMOS transistor 1204. The RF PA 1200 includes two error amplifiers. A first error amplifier 1208 generates a voltage to compensate over an ambient temperature while a second error amplifier 1210 generates a voltage to compensate parameter changes over a Tburst-RF time interval. The RF PA 1200 requires less calibration and test procedures at an initial stage of a power amplifier design as compared to the RF PA 1000 of FIG. 10.

Figure 13:
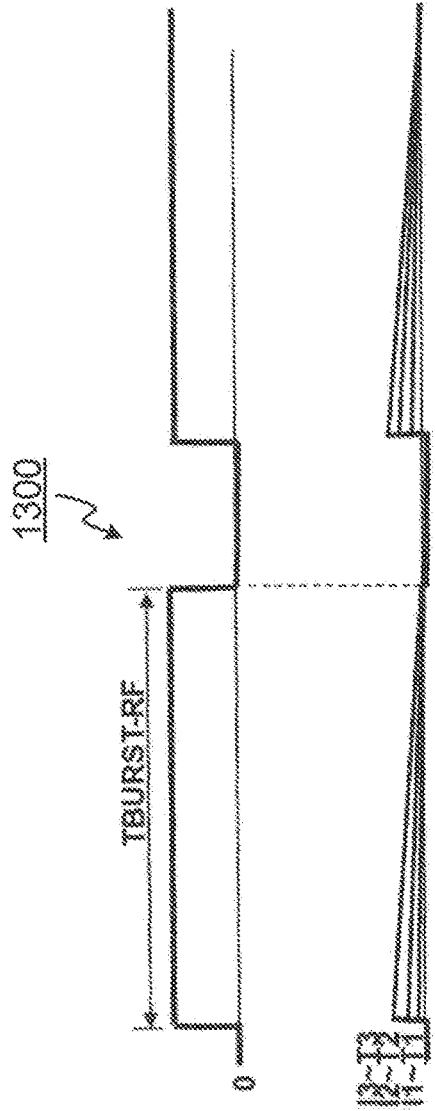
FIG. 13 depicts a waveform of an operation mode of the second implementation of a radio frequency power amplifier with an associated radio frequency matching networks and a bias block, in accordance with the present disclosure.

FIG. 13 depicts a waveform 1300 of an operation mode of the second implementation of an RF PA with an associated RF matching network and a bias block. The waveform 1300 depicts an operation mode of the RF PA 1200 of FIG. 12. A DC burst signal corresponds to a full RF burst width where Tcomp and Tburst-RF intervals are equal in width, and a current amplitude varies according to a temperature measured by the transistor temperature sensor in FIG. 12.

Figure 14:
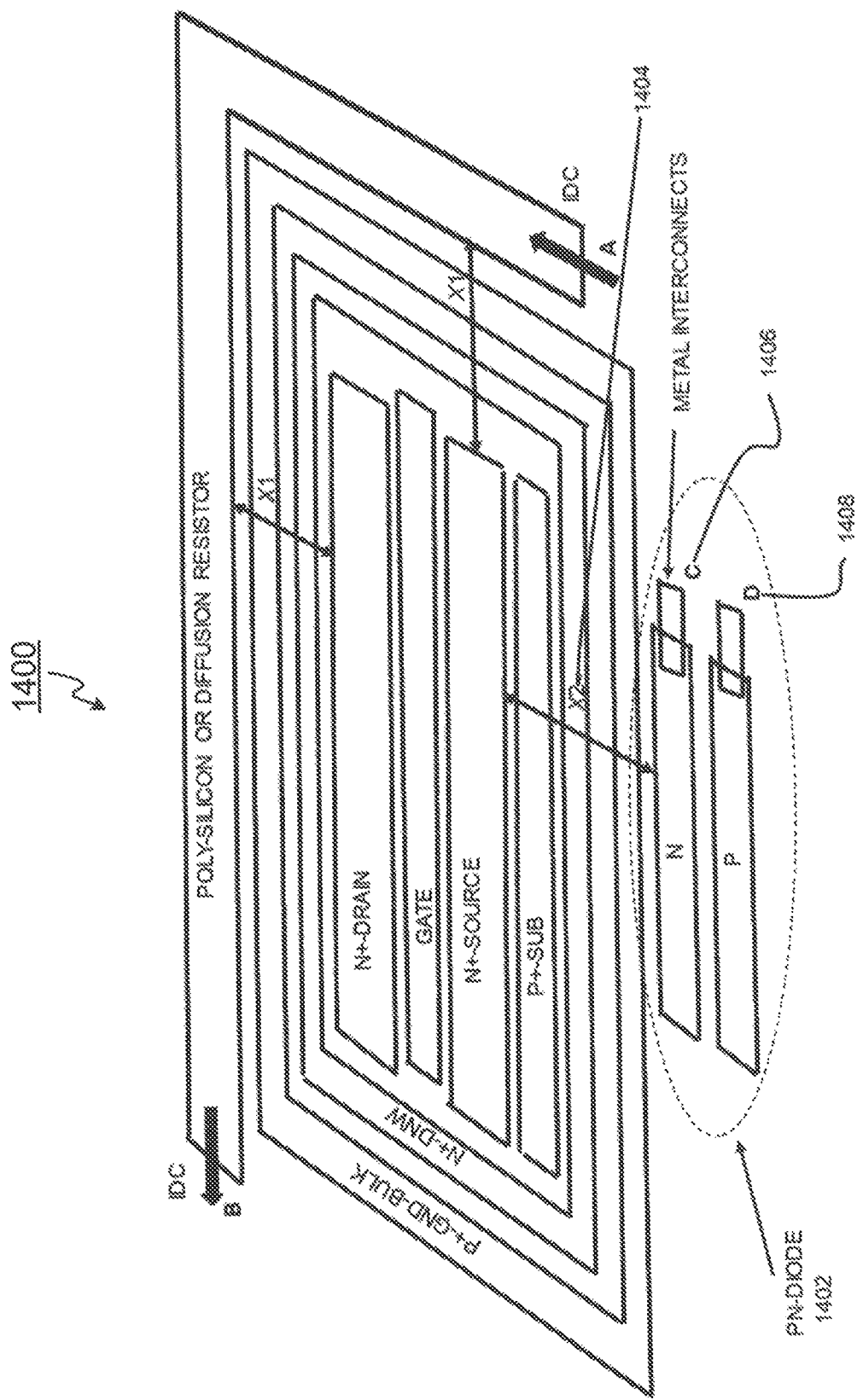
FIG. 14 is a simplified plane view of the second implementation of a radio frequency power amplifier, in accordance with the present disclosure.

FIG. 14 is a simplified plane view of the second implementation of an RF PA 1400. The RF PA 1400 is similar to the RF PA 100 of FIG. 1 in which a CMOS N-type transistor is surrounded by a polysilicon or a diffusion resistor for heating purposes. A PN-diode 1402 is placed at a close distance X2 (1404) away from an active transistor area. For example, the distance X2 (1404) may range between a few μm to several tens of μm for 0.18 μm CMOS technology. The smaller the distance X2 (1404) is, the more precisely a temperature may be controlled. However, precise control of temperature may not be needed due to a gain, an EVM, and other parameters of a power amplifier stage which controls a performance of an RF PA.

A function of the PN-diode 1402 is used to measure an absolute temperature of the active transistor area by means of measuring the current-voltage characteristic at a first terminal 1406 and a second terminal 1408 due to a current-voltage characteristic being dependent on the temperature of PN-diode 1402. In an implementation, an extensive test and calibration may be required at an initial stage of a power amplifier design due to a non-linear dependence of a current-voltage characteristics of a PN-diode over a temperature of the PN-diode.

In an implementation, the PN diode 1402 may be of a different type and/or a different configuration then depicted. In an implementation, the PN diode 1402 may be used as a transistor temperature sensor as depicted in FIG. 12. In an implementation, PN-diode 1402 may be used as an absolute temperature sensor as depicted in FIG. 12 by positioning the diode far from an active transistor area, simplifying an overall calibration procedure for two error amplifiers as depicted in FIG. 12.

Figure 15:
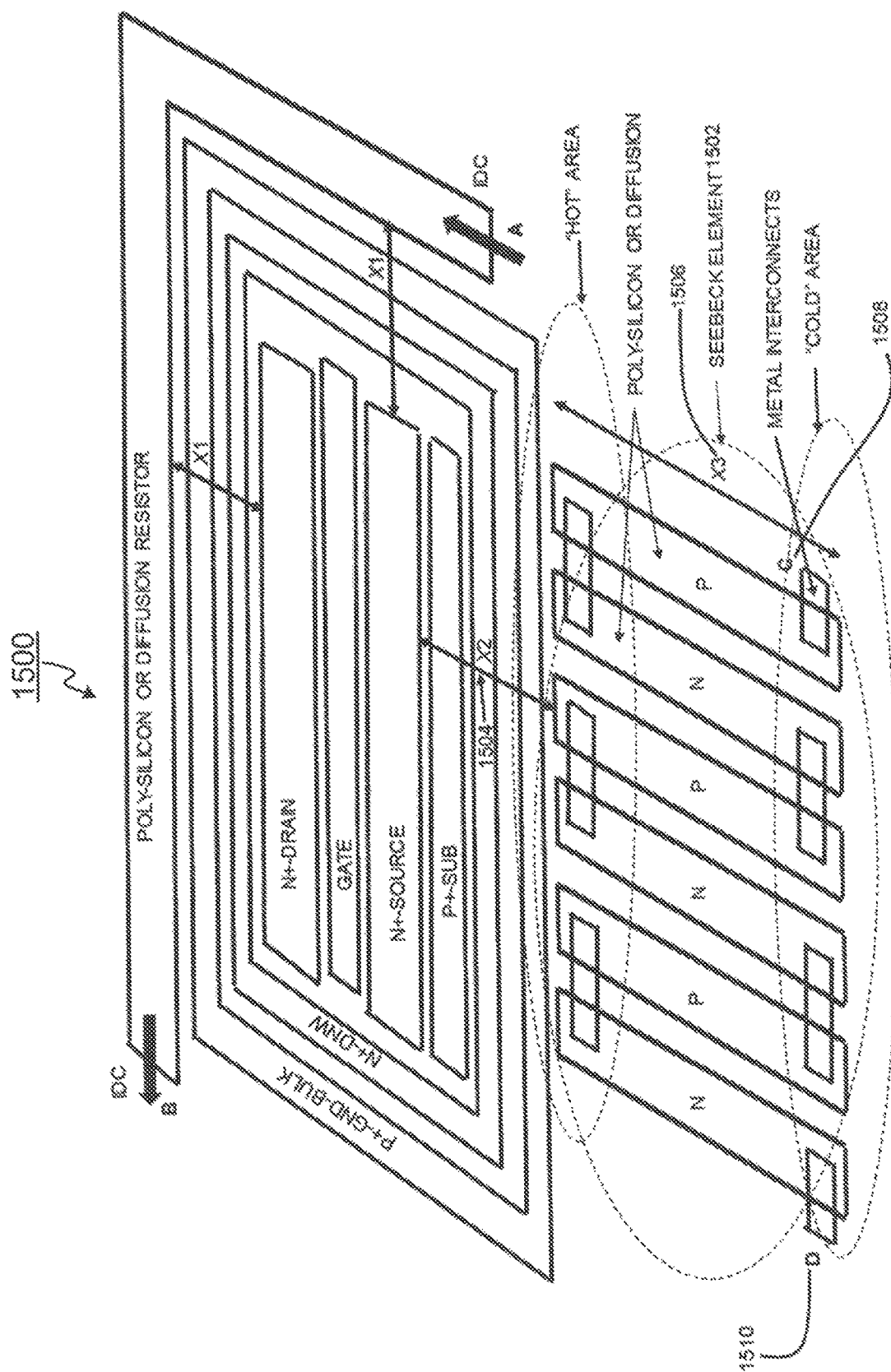
FIG. 15 is a simplified plane view of a third implementation of a radio frequency power amplifier, in accordance with the present disclosure.

FIG. 15 is a simplified plane view of a third implementation of an RF PA 1500. The RF PA 1500 is similar to the RF PA 1400 of FIG. 14 in which a CMOS N-type transistor is surrounded by a polysilicon or a diffusion resistor for heating purposes. P and N strips of either polysilicon or diffusion in Seebeck element 1502 are used for a temperature measurement instead of a PN-diode current-voltage measurement. A Seebeck element converts heat directly into electricity at the junction of different types of wire. One side of the Seebeck element 1502 is placed at a close distance X2 (1504) from an active transistor area. For example, the distance A2 (1504) may be range between a few μm to several tens of μm for 0.18 μm CMOS technology. A long trance length X3 (1506) of the Seebeck element 1502 ensures a large temperature difference between cold and hot areas of the RF PA 1500. In response to a temperature increase in the active transistor area due to a DC flow through it as well as due to a heating resistor Joule heat, the Seebeck element 1502 provides a voltage between a first node 1508 and a second node 1510. The voltage is directly proportional to a temperature difference between hot and cold areas, resulting in measurement of a relative temperature instead of an absolute temperature. Less extensive test and calibration may be required at an initial stage of a power amplifier design compared to the RF PA 1400 of FIG. 14 due to a linear dependence of a Seebeck voltage versus a temperature of a Seebeck element.

In an implementation, the Seebeck element 1502 may be effectively used in an RF PA as depicted in FIG. 1200 as a transistor temperature sensor in a closed-loop control circuit. The Seebeck element 1502 may track all temperature differences within the Tburst-RF time interval while an absolute temperature sensor is used to track an ambient temperature difference. In an implementation, Seebeck element 1502 may be used as an absolute temperature sensor by increasing the distance X3 (1506) longer than that of a Seebeck element sensor used as a transistor temperature sensor. In an implementation, a Seebeck element may be placed in close proximity to a heating resistor.

Figure 16:
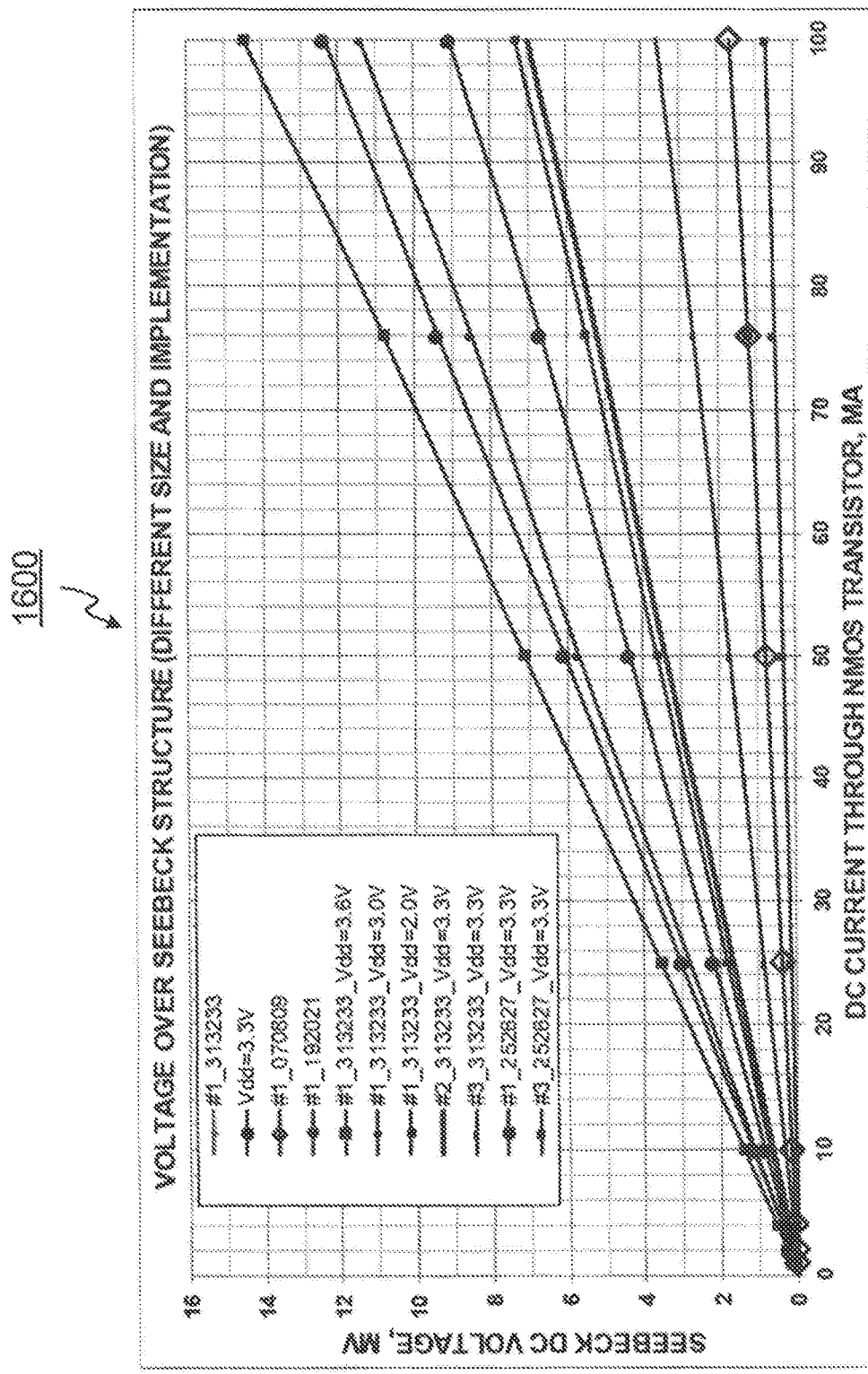
FIG. 16 is a graph showing a direct current voltage versus a direct current through a negative channel metal oxide semiconductor (NMOS) transistor, in accordance with the present disclosure.

FIG. 16 is a graph 1600 showing a DC voltage versus a direct current through a negative NMOS transistor, according to the third implementation of an RF PA. A negative channel metal oxide semiconductor (NMOS) transistor in deep-N-well with overall gate length of 1 mm based on 0.18 μm CMOS technology is used to test and plot graph 1600. The transistor is surrounded by different P and N types and size of either polysilicon or diffusion strips that include a Seebeck element. Varying DC levels are applied to the transistor and Seebeck voltages are measured. The graph 1600 shows a linear relationship between a Seeback voltage and a DC through the transistor, which is proportional to a transistor temperature.

The present disclosure is advantageous over prior systems that do not provide high linearity during RF burst signals in WiFi applications. By adding a heating resistor and a control circuit to an RF transistor, the present invention provides a highly linear radio frequency power amplication by controlling thermal effects in the RF transistor.

The exemplary embodiments described herein detail for illustrative purposes are subject to many variations of structure and design. It should be emphasized, however that the present invention is not limited to particular method of manufacturing a radio frequency power amplifier as shown and described. Rather, the principles of the present invention can be used with a variety of methods of manufacturing wearable sensor devices. It is understood that various omissions, substitutions of equivalents are contemplated as circumstances may suggest or render expedient, but the present invention is intended to cover the application or implementation without departing from the spirit or scope of the claims.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

What is claimed is:

1. A radio frequency (RF) power amplifier (PA) for amplifying an RF signal between a source node and an output node, the RF PA comprising:
   a silicon substrate with a complementary metal oxide semiconductor (CMOS) N-type transistor with a source region and a drain region fabricated therein, wherein the source region comprises the source node of the RF PA and the drain region comprises the output node of the RF PA;
   a planar resistor fabricated on the surface of the silicon substrate proximal to the drain region of the N-type transistor, wherein the resistor provides a thermal source for heating the RF PA; and
   a control circuit providing thermal heating to the RF PA by providing power to the planar resistor during RF signal bursts wherein the thermal heating compensates transient heating within the transistor and results in a linear power amplification operation.

2. The RF PA of claim 1, wherein the planar resistor comprises one of a P-type or an N-type polysilicon resistor formed between dielectric layers of the silicon substrate.

3. The RF PA of claim 1, wherein the planar resistor comprises a polysilicon resistor formed on a silicon dioxide layer over the silicon substrate.

4. The RF PA of claim 1, wherein the planar resistor comprises one of a P-type or N-type diffused region at the surface of the silicon substrate.

5. The RF PA of claim 1, wherein the planar resistor is covered with a silicon nitride layer and wherein the silicon nitride layer also lies over the transistor drain and couples thermal energy between the resistor and the transistor drain.

6. The RF PA of claim 1, wherein the planar resistor is covered in part with at least one metal layer, wherein the metal layer is in proximity to the transistor drain and is configured to couple thermal energy between the resistor and the transistor drain.

7. The RF PA of claim 1, wherein the transistor and planar resistor are powered with separate circuits.

8. A radio frequency (RF) power amplifier (PA) for amplifying an RF signal between a source node and an output node, the RF PA comprising:
   a silicon substrate with a complementary metal oxide semiconductor (CMOS) N-type transistor with a source region and a drain region fabricated therein, wherein the source region comprises the source node of the RF PA and the drain region comprises the output node of the RF PA;
   a planar resistor fabricated on the surface of the silicon substrate proximal to the drain region of the CMOS N-type transistor wherein the resistor provides a thermal source for heating the RF PA; and
   a control circuit providing thermal heating to the RF PA by providing power to the planar resistor during RF signal bursts, wherein the control circuit comprises:
      a negative channel metal oxide semiconductor (NMOS) transistor with a source, a drain, and a gate, configured as an electrical switch;
      a control block configured to generate a voltage level to set an electrical current through the NMOS transistor;
      an input configured to couple to the RF PA and the control block to transmit an electrical signal that powers the RF PA and the control block;
      a buffer;
      a resistor, wherein a first end of the resistor is coupled to the buffer and a second end of the resistor is coupled to the drain of the NMOS transistor; and
      a switch coupled to the control block and the gate of the NMOS transistor, wherein in response to the electrical signal enabling the control block, a bias voltage is provided to the gate of the NMOS transistor via the switch and the NMOS transistor is configured to transmit an electrical current from the buffer and the resistor, wherein the electrical current flows from the drain to the source of the NMOS transistor.

9. The RF PA of claim 8, wherein the planar resistor comprises one of a P-type or N-type polysilicon resistor formed between dielectric layers of the silicon substrate.

10. The RF PA of claim 8, wherein the planar resistor comprises a polysilicon resistor formed on a silicon dioxide layer over the Silicon substrate.

11. The RF PA of claim 8, wherein the planar resistor comprises one of a P-type or N-type diffused region at the surface of the Silicon substrate.

12. The RF PA of claim 8, the planar resistor covered with a silicon nitride layer wherein the silicon nitride layer also lies over the NMOS transistor drain and couples thermal energy between the resistor and the transistor drain.

13. The RF PA of claim 8, the planar resistor covered in part with at least one metal layer wherein the metal layer also lies in proximity to the NMOS transistor drain and couples thermal energy between the resistor and the NMOS transistor drain.

14. A radio frequency (RE) power amplifier (PA) for amplifying an RE signal between a source node and an output node, the RF PA comprising:
   a complementary metal oxide semiconductor (CMOS) N-type transistor with a source region and a drain region fabricated on a silicon substrate, wherein the source region comprises the source node of the RF PA and the drain region comprises the output node of the RF PA;

a negative channel metal oxide semiconductor (NMOS) transistor with a source, a drain, and a gate, configured as an electrical switch;

a control block configured to generate a voltage level to set an electrical current through the NMOS transistor;

an input configured to couple to the RF PA and the control block to transmit an electrical signal that powers the RF PA and the control block;

a buffer;

a first resistor coupled to the source of the NMOS transistor, and wherein the first resistor is fabricated on a surface of the silicon substrate proximal to the drain region of the CMOS N-type transistor, wherein the resistor provides a thermal source for heating the RF PA;

a second resistor, wherein a first end of the second resistor is coupled to the buffer and a second end of the second resistor is coupled to the drain of the NMOS transistor; and a switch coupled to the control block and the gate of the NMOS transistor, wherein in response to the electrical signal powering the control block, a bias voltage is provided to the gate of the NMOS transistor via the switch and the NMOS transistor is configured to transmit an electrical current from the buffer and the second resistor, wherein the electrical current flows from the drain to the source of the NMOS transistor.

15. The RF PA of claim 14, further comprising an absolute temperature sensor configured to measure a temperature on a semiconductor die of the CMOS N-type transistor at a far distance from the CMOS N-type transistor, and wherein the absolute temperature sensor converts the temperature to a particular voltage level.

16. The RF PA of claim 15, wherein the absolute temperature sensor provides a voltage signal to compensate ambient temperature variations of the CMOS N-type transistor.

17. The RF PA of claim 15 further comprising a local transistor temperature sensor configured to measure a temperature of the CMOS N-type transistor.

18. The RF PA of claim 15 further comprising an error amplifier configured to compare a voltage level of the absolute temperature sensor with a voltage level of the control block and to provide a voltage of an error signal proportional to a difference between the compared voltage levels.

19. The RF PA of claim 17 further comprising a plurality of error amplifiers configured to provide a voltage signal for compensation over a temperature of the CMOS N-type transistor and a temperature signal at a distance proximate to the absolute temperature sensor from the CMOS N-type transistor.

20. The RF PA of claim 18 further comprising a temperature compare switch configured to provide a voltage of the error signal to be applied to the buffer to provide an electrical current to the first resistor.

* * * * *